US006885491B2

(12) United States Patent
Ross-Messemer et al.

(10) Patent No.: US 6,885,491 B2
(45) Date of Patent: Apr. 26, 2005

(54) DIFFRACTION-OPTICAL COMPONENT, ILLUMINATION SYSTEM AND EXPOSURE SYSTEM COMPRISING SUCH A DIFFRACTION-OPTICAL COMPONENT AS WELL AS AN EXPOSURE METHOD EMPLOYING SUCH AN EXPOSURE SYSTEM

(75) Inventors: Martin Ross-Messemer, Essingen (DE); Alexander Menck, Jena (DE); Frank Höller, Aalen (DE); Kurt Franke, Dresden (DE); Günter Martin, Dresden (DE); Hagen Schmidt, Leipzig (DE); Manfred Weihnacht, Malter (DE)

(73) Assignee: Carl-Zeiss-Stiftung (trading as Carl Zeiss), Heidenheim (Brenz) (DE)

( * ) Notice: Subject to any disclaimer, the term of this patent is extended or adjusted under 35 U.S.C. 154(b) by 49 days.

(21) Appl. No.: 10/102,613

(22) Filed: Mar. 20, 2002

(65) Prior Publication Data

US 2003/0007712 A1 Jan. 9, 2003

(30) Foreign Application Priority Data

Mar. 21, 2001 (DE) .......................................... 101 13 788

(51) Int. Cl.[7] ............................. G02F 1/11; G02F 1/33; H04B 11/00; H03H 9/00; H01L 41/04
(52) U.S. Cl. ....................... 359/285; 359/287; 359/305; 359/311; 359/312; 359/254; 333/141; 333/145; 333/195; 310/313 B; 310/313 D; 310/313 R; 73/32 A; 345/177; 385/129; 369/44.12
(58) Field of Search .................. 369/44.12, 112.27; 356/521; 333/141, 145, 147, 195; 73/32 A, 24.05, 204.23; 345/177; 385/129, 130; 359/285, 286, 287, 305, 311, 312, 254, 859, 731, 558; 310/313 A, 313 B, 313 D, 313 R

(56) References Cited

U.S. PATENT DOCUMENTS 3,684,892 A    8/1972 Lean et al. ................. 307/88.3

(Continued)

FOREIGN PATENT DOCUMENTS

DE    694 17 171 T2    3/1999    ............. G03F/9/00

(Continued)

OTHER PUBLICATIONS

Excerpt from ESRF's Online Annual Report, 1995/1996:

(Continued)

*Primary Examiner*—Loha Ben
(74) *Attorney, Agent, or Firm*—Osha & May L.L.P.

(57) ABSTRACT

A diffraction-optical component for providing a radiation-diffracting grating structure is proposed, comprising a surface wave device including a substrate 43, a surface wave source 47 excitable with an adjustable frequency for producing surface waves on a surface 45 of the substrate 43 and an interaction region 17 of the substrate surface 45 which is provided for the radiation to interact with a grating structure provided by the surface waves produced.

To this end, the surface wave source 47 may have a directional characteristic and emits surface waves stronger in a preferred direction 53 than in a direction 54 opposite thereto, the surface wave source may comprises an electro-acoustic transducer which includes spaced apart sections for emitting surface waves at different wavelengths, an electro-acoustic transducer of the surface wave source may be operated as a voltage divider with an intermediate electrode, the frequency for exciting the surface wave source may be adjusted in response to a measuring signal which is obtained by a surface wave receiver 73, a surface wave damper 73, 87 may be provided in the form of an acousto-electric transducer, a closed propagation path may be provided for the surface waves and the grating structure may be formed by standing surface waves.

Moreover, an exposure system is proposed which comprises such a diffraction-optical component and a radiation source.

56 Claims, 9 Drawing Sheets

U.S. PATENT DOCUMENTS

| | | | | |
|---|---|---|---|---|
| 4,006,967 A | | 2/1977 | Kenan et al. | 350/160 R |
| 4,085,348 A | * | 4/1978 | Munier | 310/313 B |
| 4,328,472 A | * | 5/1982 | Grudkowski | 333/141 |
| 4,370,030 A | | 1/1983 | Sprague | 350/358 |
| 4,474,467 A | * | 10/1984 | Hardy et al. | 356/521 |
| 4,521,711 A | | 6/1985 | Okamoto et al. | 310/313 B |
| 4,635,008 A | | 1/1987 | Solie | 333/195 |
| 4,736,172 A | | 4/1988 | Ebneter | 333/193 |
| 4,862,440 A | * | 8/1989 | Miyamoto et al. | 369/44.12 |
| 4,910,839 A | | 3/1990 | Wright | 29/25.35 |
| 5,003,822 A | * | 4/1991 | Joshi | 73/204.23 |
| 5,028,101 A | | 7/1991 | Sugai et al. | 333/193 |
| 5,073,763 A | | 12/1991 | Wright | 333/193 |
| 5,162,689 A | | 11/1992 | Fliegel et al. | 310/313 B |
| 5,264,751 A | | 11/1993 | Dufilie et al. | 310/313 B |
| 5,287,036 A | | 2/1994 | Penunuri | 310/313 R |
| 5,327,039 A | | 7/1994 | Yamada | 310/313 B |
| 5,334,960 A | | 8/1994 | Penunuri | 333/193 |
| 5,365,206 A | | 11/1994 | Machui et al. | 333/195 |
| 5,406,159 A | | 4/1995 | Wright | 310/313 |
| 5,646,584 A | | 7/1997 | Kondratyev et al. | 333/193 |
| 5,657,152 A | * | 8/1997 | Kadota | 359/305 |
| 5,689,362 A | * | 11/1997 | Kadota | 359/305 |
| 5,742,425 A | * | 4/1998 | Kump et al. | 359/285 |
| 5,744,721 A | | 4/1998 | Varnum | 73/579 |
| 5,773,911 A | | 6/1998 | Tanaka et al. | 310/313 B |
| 5,831,492 A | | 11/1998 | Solie | 333/193 |
| 5,890,789 A | * | 4/1999 | Inagaki et al. | 359/305 |
| 5,973,826 A | | 10/1999 | Chapman et al. | 359/355 |
| 6,033,079 A | | 3/2000 | Hudyma | 359/857 |
| 6,091,406 A | * | 7/2000 | Kambara et al. | 345/177 |
| 6,142,641 A | | 11/2000 | Cohen et al. | 359/859 |
| 6,147,574 A | | 11/2000 | Kidoh | 333/195 |
| 6,208,062 B1 | * | 3/2001 | Nysen et al. | 310/313 R |
| 6,285,493 B1 | * | 9/2001 | Carrott et al. | 359/311 |
| 6,388,360 B1 | * | 5/2002 | Nysen et al. | 310/313 R |
| 6,543,274 B1 | * | 4/2003 | Herrmann et al. | 73/32 A |
| 2002/0009178 A1 | | 1/2002 | Dinger et al. | 378/84 |

FOREIGN PATENT DOCUMENTS

| | | | | |
|---|---|---|---|---|
| EP | 0 580 307 A1 | 1/1994 | | H03H/9/145 |
| EP | 0 658 813 B1 | 3/1999 | | G03F/9/00 |
| JP | 60-182426 A | 9/1985 | | G02F/1/33 |
| JP | 63-115131 A | 5/1988 | | G02F/1/11 |
| JP | 10-96881 A | 4/1998 | | G02F/1/11 |
| JP | P2000-180906 A | 6/2000 | | G02F/1/33 |
| WO | WO86/06505 | 11/1986 | | G02F/1/11 |

OTHER PUBLICATIONS

ID32, "http://www/esrf.fr/info/science/annrep/95–96/report/id32.htm", dated Jan., 2001.

European Search Report No. EP 02 00 6299 dated Feb. 3, 2004 (4 pages).

S. Hayashi, "A Versatile Photoelastic–Modulator Driver/Controller", Japanese Journal of Applied Physics, vol. 28, No. 4, Apr. 1989 pp. 720–722 (3 pages—cited in European Search Report listed as A2).

European Search Report dated Nov. 18, 2003 (5 pages).

R. Tucoulou et al.; "One and two dimensional space scannings of s–ray beams by diffraction on surface acoustic waves: Application to x–ray imaging"; Review of Scientific Instruments, vol. 69, No. 7; Jul. 1998; pp. 2704–2707.

Patent Abstracts of Japan, publication No. 01252015, publication date Oct. 6, 1989 (1 page).

2000180906 A; Patent Abstracts of Japan; Jun. 30, 2000;.

60181426 A; Patent Abstracts of Japan; Sep. 18, 1985;.

10096881 A; Apr. 14, 1998; Patent Abstracts of Japan;.

63115131 A; May 19, 1988; Patent Abstracts of Japan;.

* cited by examiner

DIFFRACTION-OPTICAL COMPONENT, ILLUMINATION SYSTEM AND EXPOSURE SYSTEM COMPRISING SUCH A DIFFRACTION-OPTICAL COMPONENT AS WELL AS AN EXPOSURE METHOD EMPLOYING SUCH AN EXPOSURE SYSTEM

BACKGROUND OF INVENTION

The invention relates to a diffraction-optical component for providing a radiation-diffracting grating structure, said grating structure being providable by surface waves on a surface of a substrate for diffracting and deflecting an incident beam of light. A wavelength of the light to be diffracted at the grating structure may first have any wavelength of the optical spectrum. In particular, the invention, however, relates a diffraction-optical component for providing a grating structure for diffracting light in the ultraviolet region, the extreme ultraviolet region (EUV) with wavelengths of about 0.1 nm to about 100 nm, as well as the X-ray region. Furthermore, the invention relates to an illumination system by means of which a beam of light, in particular, in the ultraviolet, extreme ultraviolet and X-ray wavelength regions, can be deflected and controlled. Moreover, the invention relates to an exposure system for imaging a pattern provided on a mask onto a substrate, a light beam used for the imaging being controllable by the diffraction-optical component and the pattern constituting, in particular, components of a miniaturized device. Moreover, the invention relates to an exposure method for manufacturing a miniaturized device in a photolithographic step.

In the manufacture of miniaturized devices, in particular, of semiconductor devices, usually a photolithographic step is employed in order to image structures defined on a mask onto a substrate comprising a radiation sensitive layer and, thereby, to expose the radiation sensitive layer. Here, a lower dimensional limit of the imaged structures (CD=critical dimension) is defined by the wavelength of the light used for the imaging. As the structures of the miniaturized devices to be manufactured are constantly decreasing, the wavelengths of the light to be used for the imaging must get increasingly shorter. However, for wavelengths below the ultraviolet region, optical imaging components and beam guidance or deflection components are difficult to handle and, so far, adequate technologies for such components have not been developed. Examples of optical illumination systems in the EUV region are known from U.S. Pat. Nos. 5,973,826, 6,033,079 and 6,142,641.

From ESRF, "Annual Report, 1995/1996:ID32" in http://www.esrf.fr/info/science/annrep/95–96/report/exp/id32/id32.htm (Jan. 29, 2001) an X-ray chopper is known for switching X-radiation through a switchable optical grating provided by surface waves (SAW=SURFACE ACOUSTIC WAVES). However, in this known arrangement, a diffraction intensity of the SAW grating and thus an intensity of the switchable beam is too low for the surface wave device described therein to be economically employable in lithographic processes.

SUMMARY OF INVENTION

It is an object of the present invention to propose a diffraction-optical component for providing a radiation-diffracting grating structure which enables an efficient beam control and beam diffraction, in particular, with short wavelengths. Moreover, it is an object of the invention to propose a diffraction-optical component for providing a radiation-diffracting grating structure with a high diffraction efficiency for short optical wavelengths.

Furthermore, it is an object of the present invention to propose a diffraction-optical component which enables a beam deflection into several spatial directions.

A further object of the invention is to propose an exposure system which is suitable for the imaging of comparatively small patterns. In particular, it is an object of the invention to propose an exposure system which has a comparatively high numerical aperture.

Moreover, it is a further object of the invention to propose a method for device manufacture which is particularly suitable for the manufacture of devices with small structures.

The invention proceeds from a diffraction-optical component for providing a radiation-diffracting grating structure which comprises a surface wave device including a substrate, a surface wave source for producing surface waves on a surface of the substrate and an interaction region of the substrate surface which is provided for the radiation to interact with a grating structure provided by the surface waves produced.

According to a first aspect, the invention is based on the finding that a high diffraction efficiency can be provided by the SAW grating structure if the SAW grating structure produces a high-quality diffraction grating which, in the ideal case, is formed by wave trains of surface waves, the profiles of which are of the same, preferably, of substantially sinusoidal shape over the entire interaction region. It has been found in this respect that the surface wave source of the conventional diffraction-optical component emits, besides surface waves which are emitted towards the interaction region, also surface waves which are not directed towards the interaction region. These surface waves, which are actually directed away from the interaction region, are, however, reflected at edges of the substrate and, eventually, reach the interaction region nevertheless, possibly on byways, where they disturb the profiles of the surface waves which have been directly emitted by the surface wave source to the interaction region and thus reduce the quality of the optical grating.

In order to reduce such surface waves which undesirably reach the interaction region on byways, it has already been proposed to apply surface wave dampers made of an elastic material on the substrate in propagation paths of surface waves which are not directly directed to the interaction region. However, the damping efficiency of such known dampers is not always adequate.

According to the first aspect, the invention is based on the idea that surface waves which are not emitted towards the interaction region should not be generated at all on the substrate from the outset.

To this end, the invention proposes providing as surface wave source a unidirectional source, i.e., a surface wave source having a directional characteristic which emits surface waves into a preferred direction stronger than into a direction opposite thereto, and disposing the surface wave source relative to the interaction region such that the surface waves emitted into the preferred direction traverse the interaction region, possibly after having been deflected by surface waves mirrors or the like.

The use of such a unidirectional surface wave source thus prevents the generation of undesired surface waves which are not, as desired, directed to the interaction region and could indirectly and undesirably be reflected into the same.

According to a further aspect, the invention is based on the contemplation that, in order to control and change the deflection or diffraction angle between entering and exiting beam, a grating constant of the grating structure must be changeable. The conventional diffraction-optical component, however, is capable to achieve this only to a very limited extent. Accordingly, the invention is based on the idea to use in the surface wave device a surface wave source which is provided for the emission of surface waves at several wavelengths which differ from each other.

According to this aspect, the invention is distinguished in that the surface wave source comprises an electro-acoustic transducer with an electrode structure which comprises a plurality of sub-electrodes which are positioned spaced apart from adjacent sub-electrodes. Here, the electrode structure comprises a plurality of sections which are arranged adjacent to and spaced apart from each other in emission direction of the surface waves, said sub-electrodes being periodically arranged in each one of said sections. The different sections differ from one another in that the arrangement periods of the sub-electrodes in the respective sections differ from one another.

As the arrangement period of sub-electrodes of a section determines the wavelength at which said section emits surface waves with increased efficiency, a surface wave source is provided, due to the sections as a whole being arranged at different arrangement periods, which surface wave source is capable of emitting surface waves over a comparatively wide wavelength range with comparatively high efficiency.

According to a further aspect, the invention proceeds from the contemplation that, in order to achieve a high diffraction efficiency, a surface wave grating with a high surface wave amplitude must be provided. In a surface wave source with electro-acoustic transducer, the amplitude of the emitted surface waves can be increased in that alternating-current (a-c) voltages with a higher voltage amplitude are applied to electrodes of the electro-acoustic transducer. However, in practice, the maximum voltage amplitude which can be applied to the electro-acoustic transducer is limited by electric flashovers between electrodes and sub-electrodes of the transducer According to this aspect, the invention is based on the idea to employ an electro-acoustic transducer which already produces high amplitude surface waves when a comparatively low voltage is applied.

According to this aspect, the invention is distinguished in that the electro-acoustic transducer comprises two groups of finger electrodes, the finger electrodes of each group being electro-conductively connected to each other and the finger electrodes of different groups being electrically insulated from each other. In operation of the electro-acoustic transducer, the electric a-c driving voltage is applied to these groups of finger electrodes of the electro-acoustic transducer. Between pairs of finger electrodes of different groups, there is provided at least one intermediate electrode which is electrically insulated from the finger electrodes of the two groups. The electric potential of this intermediate electrode preferably adjusts itself freely or is floating, so that a voltage divider, so to speak, is provided by the components finger electrode of the first group, intermediate electrode and finger electrode of the other group, an electric voltage between two adjacent electrodes being lower than the voltage applied between the groups of finger electrodes as a whole. This measure effectively reduces the tendency of flashovers between electrodes of the electro-acoustic transducer, the electro-acoustic transducer being nevertheless capable of emitting high amplitude surface waves.

Preferably, the intermediate electrode, too, just as the finger electrodes, is of periodic structure, wherein branch electrodes emanating from the intermediate electrode extend between adjacent finger electrodes.

In order for the electrode structure as a whole to act as voltage divider, it is advantageous in this interlaced structure of finger electrodes and branch electrodes that the finger electrodes of different groups extend parallel to and off-set from each other, but preferably not on a common straight line. In this respect, it is likewise advantageous that finger electrodes and branch electrodes are allocated to each other in pairs and the branch electrodes and finger electrodes allocated to one another respectively extend approximately on common straight lines.

According to a further aspect, the invention is again based on the finding that, in order to achieve a high diffraction efficiency, it is required for the surface waves providing the radiation-diffracting grating structure to have a high amplitude. In this respect, the invention is based on the idea to adjust a frequency for the excitation of the surface wave source such that the amplitude of the surface waves emitted by the surface source is substantially maximal.

According to this aspect, the invention is distinguished in that a surface wave receiver for surface waves emitted by the surface wave source is provided on the substrate which supplies a measuring signal representing an amplitude of the surface waves impinging on the surface wave receiver. Furthermore, a control means is provided for adjusting the frequency for exciting the surface wave source in response to the measuring signal of the surface wave receiver.

As a result, a configuration is provided which allows to change the frequency for exciting the surface wave source, possibly iteratively, until the amplitude of the received surface waves is substantially maximal. It may then be assumed that the surface wave source also emits surface waves of maximum amplitude and that, furthermore, the grating structure is provided in the interaction region by surface waves of maximum amplitude as well.

In a surface wave source which is designed to emit surface waves having an amplitude as high as possible, the amplitude of the surface waves emitted, typically in response to the excitation frequency, is such that, at a medium frequency, the amplitude of the generated surface waves is at a maximum and decreases on both sides of the medium frequency with a characteristic frequency width. Equally, in a surface wave receiver, the shape of the measuring signal responsive to the surface wave frequency is typically such that, at a constant amplitude of the received surface waves, it likewise drops on both sides of a medium frequency with a characteristic frequency width.

Preferably, the surface wave sources and the surface wave receiver are adjusted to one another such that the characteristic frequency width of the surface wave source is smaller than the typical frequency width of the surface wave receiver. As a result, it is possible, on the one hand, to optimize the surface source with a view to the emission of high amplitudes and, on the other hand, to provide a receiver which is capable of receiving surface waves with high efficiency at different medium frequencies of the surface wave source. Such a design is particularly advantageous with a view to the aspect that the medium frequency at the surface wave source need not be constant in terms of time as a result of, for example, temperature drifts or that the surface wave source is deliberately driven with varying frequencies to change the deflection or diffraction angle. It is then possible to adjust the frequency for exciting the surface wave source solely in response to the measuring signal of the surface wave receiver in order to achieve substantially the maximum surface wave amplitude possible.

In order for the frequency for generating the maximum surface wave amplitude possible to be adjusted with more precision, the frequency is controlled not only dependent upon the measuring signal but also dependent upon the shape of the measuring signal in response to the frequency. As a result, the dependency of the measuring signal on the frequency is also taken into consideration and a frequency can be adjusted with even more precision.

According to a further aspect, the invention is again based on the contemplation that, in order to achieve a high diffraction efficiency, a grating structure of a high grating quality is required. According to this aspect, the invention is based on the finding that surface waves which have been emitted by the surface wave source propagate further on the substrate, after having traversed the interaction region, until they finally impinge on a substrate edge from where they are, possibly along byways, reflected back to the interaction region where they adversely affect the profiles of the actually desired grating structure.

According to this aspect, the invention proposes damping the surface waves after they have traversed the interaction region by means of a surface wave damper so that an intensity of surface waves reflected back into the interaction region is as little as possible.

Such a surface wave damper, for example, may be formed of an elastomeric material which is applied to the substrate and in which the mechanical energy of the surface waves is dissipated into thermal energy. A disadvantage of such a surface wave damper resides in that it produces heat on the substrate which changes the propagation characteristics of the surface waves on the substrate.

According to a preferred embodiment of the invention, the surface wave damper is, therefore, provided as acousto-electric transducer for converting the mechanical energy of the surface waves into electrical energy at the location of the surface wave damper. The electric energy can then be removed from the substrate, without the latter being subjected to thermal stress, and dissipated in suitable manner at a location remote from the substrate, so that a thermal stress imparted to the substrate by the surface wave damper is comparatively low.

To this end, preferably, the acousto-electric transducer comprises at least two electric terminals for the produced electric energy to be discharged in that a resistive circuit is connected to dissipate the discharged electric energy in the resistive circuit.

In order to convert the mechanical energy of the surface waves into electric energy as efficiently as possible and to discharge the same and dissipate it as completely as possible, preferably, electric impedances of the electro-acoustic transducer and the resistive circuit are adjusted to one another such that they have conjugated-complex values.

Preferably, the structures of the electro-acoustic transducer of the surface wave source and the structures of the acousto-electric transducer of the surface wave damper are symmetric relative to one another. In particular, sub-electrodes are symmetrically configured.

As, however, the surface waves emitted by the surface wave source suffer a loss of amplitude and energy on their way to the surface wave damper and the surface wave source does not convert the entire electric energy supplied into surface waves either, it is to be assumed, even with an ideal symmetry between surface wave source and surface wave damper, that the substrate has a higher operating temperature in the area of the surface wave source than it has in the area of the surface wave damper. Since the propagation speed of the surface waves as well as the distance of the sub-electrodes of the electro-acoustic transducer or the acousto-electric transducer are temperature-dependent, it further follows that the originally symmetrically adjusted components surface wave source and surface wave receiver are no longer ideally adjusted to one another due to a temperature difference. Moreover, it is also possible, by differently configuring the surface source wave and the surface wave receiver and by thermal intervention, such as the cooling of specific areas of the substrate, to produce temperature differences between surface wave source and surface wave receiver. In this respect, it is also possible that the surface wave receiver has a higher temperature than the surface wave source. In this case, too, an originally ideal configuration and adjustment of the components surface wave source and surface wave receiver, i.e., both components have the same temperature, is disturbed.

Accordingly, the invention takes different operating temperatures of the surface wave source and the surface wave receiver into account in that arrangement periods of sub-electrodes of the electro-acoustic transducer of the surface wave source and the acousto-electric transducer of the surface wave damper are different from each other, the difference of the arrangement periods being adjusted to the differences in the operating temperatures to be expected for the components.

Preferably, the arrangement periods of the electro-acoustic transducer and the acousto-electric transducer differ from each other in the range of about 0.01% to about 0.5%, preferably about 0.01% to about 0.05%, particularly preferred about 0.05% to 0.15% and equally preferred about 0.15% to about 0.5%.

Preferably, the surface wave damper has a directional characteristic to the effect that surface waves which impinge on the surface wave damper from a preferred direction are dampened stronger than surface waves which impinge on the surface wave damper from a direction opposite thereto. The advantage of such a unidirectionality of the surface wave damper is understandable if one considers that an acousto-electric transducer and an electro-acoustic transducer basically may comprise identical or similar electrode structures. A unidirectional electro-acoustic transducer emits surface waves into a preferred direction with a higher efficiency. Accordingly, it is understandable that surface waves which impinge on an acousto-electric transducer merely from one direction are absorbed with particularly high efficiency if the acousto-electric transducer has an electrode structure which corresponds to that of a unidirectional electro-acoustic transducer.

Preferably, the surface wave damper is disposed such that surface waves which have passed through the interaction region and acted there as optical grating are damped by the surface wave damper in order to reduce a thermal stress of the substrate and also to prevent these surface waves from being returned to the interaction region after having been reflected, for example, at substrate edges.

Preferably, the surface wave damper is, however, also used to absorb surface waves which have not been emitted towards the interaction region by the surface wave source.

According to a still further aspect, the invention again proceeds from the contemplation that, in order to obtain a diffraction efficiency as high as possible, the surface waves must have high amplitudes. According to this aspect, the invention is based on the idea that surface waves which have traversed the interaction region are not destroyed in a surface wave damper, but returned into the interaction region.

According to this aspect, the invention is distinguished in that several mirrors for surface waves are disposed on the substrate such that the mirrors provide a closed propagation path for the surface waves and the interaction region is disposed in said closed propagation path. As a result, the surface wave energy which has passed through the interaction region is returned to the interaction region via the closed propagation path in order to contribute there to an increase of the surface wave amplitude.

Preferably, the surface wave source is likewise disposed in the closed propagation path, the surface wave source exhibiting, however, a directional characteristic and emitting surface waves stronger in a preferred direction than into a direction opposite thereto. The preferred direction of the surface wave source thus defines the direction of propagation of the surface waves in the closed propagation path.

Alternatively, it is also preferred to dispose the surface wave source outside of the closed propagation path and to feed the surface waves emitted by the same into the closed propagation path. This configuration is advantageous in that the surface wave source itself is not subjected to the highest amplitude of the surface waves. This increases the service life of the surface wave source, because effects such as material migration in the structures of the surface wave source are reduced.

The surface waves emitted by the surface wave source are preferably fed into the closed propagation path by means of a mirror which reflects the surface waves to be fed-in into the closed propagation path and which is transparent for surface waves propagating along the closed propagation path.

Moreover, it is advantageous to dispose mirrors on the substrate such that surface waves which have traversed the interaction region in one direction are deflected such that they traverse the interaction region again in another direction. As a result, an optical grating is produced which can diffract or deflect radiation incident thereon not only in one spatial direction but also in several spatial directions.

According to a further aspect, the invention is again based on the contemplation that, in order to obtain a high diffraction efficiency, it is advantageous to employ a grating with high grating amplitudes.

According to this aspect, the invention is distinguished in that the radiation-diffracting grating structure is provided in the interaction region on the substrate by standing surface waves. This can be accomplished, for example, in that a surface wave resonator is formed on the substrate by means of surface wave mirrors or other deflection elements for surface waves, i.e., a structure in which surface waves can be resonantly superposed and thus an amplitude increase of the waves circulating in the resonator can be achieved.

According to an advantageous embodiment, the surface waves which have traversed the interaction region are reflected back again, substantially in proper phase, into the interaction region by means of one or more mirrors. Here, in particular, the propagation paths of the surface waves directly after having traversed the interaction region and after having been reflected back into the interaction region may coincide and merely differ in their direction.

In order to obtain a simple structure and simple feed-in of the surface waves emitted by the surface wave source into the resonator, the surface wave source itself is disposed within the resonator.

However, it is also preferred that the surface wave source is disposed outside of the resonator and thus outside of the propagation path of the surface waves in the resonator and that the surface waves emitted by the surface wave source outside of the resonator are fed into the resonator. This is advantageous in so far as the surface wave source as such is not subjected to the high surface wave amplitudes in the resonator which may result into a longer service life of the surface wave source.

If the surface wave source is disposed outside of the resonator, the surface waves are preferably fed into the resonator by means of a surface wave mirror.

Preferably, the above-described diffraction-optical component with a grating structure provided by surface waves is employed in an illumination system which comprises, in addition to the diffraction-optical component, a radiation source whose radiation is directed to the interaction region of the surface wave device. The radiation of the radiation source incident on the interaction region is diffracted or deflected at the grating structure, the grating structure being variable by varying the operating mode of the surface wave device, the diffraction or deflection angle being thus deliberately variable.

The term radiation source, as used herein, is meant to embrace any radiation source which directs its radiation directly or indirectly, i.e., after one or more reflections or with imaging optical elements being interposed, to the interaction region. Equally, so-called virtual radiation sources which are visible for the interaction region and whose light strikes the interaction region are meant to be embraced by this term.

Preferably, the radiation source emits the radiation directed to the interaction region continuously. This can be utilized, in particular, in embodiments wherein the surface waves continuously propagate in the interaction region in order to produce a deflected beam with constant intensity.

It is also provided for that surface waves travel through the interaction region as pulses or as wave trains which are spatially limited in propagation direction so that, in particular, a deflected beam is simple to switch.

When standing waves are produced in the interaction region, a beam which continuously strikes the interaction region sees, alternating in time, a grating with alternately high and low grating amplitude. There are thus also points in time at which the grating amplitude is substantially Zero. As a result, the intensity of a deflected or diffracted beam is likewise modulated in time and assumes values between Zero and a maximum intensity.

In order to primarily produce deflected or diffracted radiation exhibiting substantially maximal diffraction intensity with standing diffraction waves, the radiation source of the illumination system is preferably a pulsed radiation source, i.e., a radiation source which does not emit its radiation at an intensity which is constant in time. Furthermore, it is then provided for that the radiation source is synchronized with the surface wave device producing the standing surface waves such that, at points in time or in periods of time at or in which the intensity emitted by the radiation source has a comparatively high value, the amplitudes of the standing surface waves assume a comparatively high value as well. This means, that the radiation pulses strike the grating structure whenever they have their substantially maximum grating amplitude.

As pulsed radiation source, there are preferably provided: a continuous radiation source combined with a time-varied shutter, for example, a chopper, and an intrinsically pulsed radiation source, such as a pulse train emitting laser or also a synchrotron whose charged particles circulate as particle packages in the storage ring.

In order to synchronize the radiation source with the surface wave device, preferably a control means is provided for adjusting a frequency and a phase position of the produced surface waves, said control means being responsive to a signal representing the pulse train of the radiation source or a train of sub-pulses of the radiation source. Said control means then acts to adjust the points in time at which the produced grating structure has high grating amplitudes to the points in time at which the intensity of the radiation emitted by the radiation source is likewise high.

As an alternative or in addition to that, it is also preferred to provide a control means for adjusting the frequency and phase position of the pulses emitted by the radiation source to the amplitudes of the grating structure. In this case, the radiation source is synchronized in relation to the surface wave device.

An advantageous application of the illumination system resides in the exposure of a substrate with patterns or images, i.e., with a position-dependent radiation intensity. To this end, the pattern for the substrate to be exposed with is preferably provided by a mask, and the illumiation system is supplemented by an imaging system which images the mask onto the substrate.

The exposure system provided thereby comprises preferably a substrate support and a mask support on which a substrate to be exposed and a mask defining the pattern to be imaged are respectively mountable such that their effective areas are disposed in a predetermined substrate plane and mask plane, respectively, of the illumination system. Furthermore, a condenser is provided for focusing light of the radiation source which has been diffracted at the grating structure into different spatial directions onto the mask. The radiation which has been diffracted at the grating structure into different directions may be radiation which, at a point in time, has been diffracted, for example, in different orders of diffraction, i.e., at different diffraction angles, and it may also be radiation which has been deflected, successively in time, at a different deflection or diffraction angle. This may, for example, be accomplished in that a grating period of the grating structure is varied in time in that the surface wave device is excited, in time-dependent manner, with different frequencies.

Accordingly, the described arrangement of radiation source, diffraction-optical component, condenser and mask support and the corresponding mask surface enables the mask surface to be exposed either simultaneously or successively in time with radiation which impinges on the mask surface at different angles of incidence. As a result, an illumination system is provided for exposing the mask surface which has a comparatively high numerical aperture.

In order to image the mask surface onto the substrate surface, there is then advantageously further provided an objective which is disposed in respect of the mask support and the substrate support such that the radiation which, due to the different angels of incidence on the mask surface, is reflected by the mask surface likewise at different angles is again focused onto the substrate surface. As a result, the substrate surface is also exposed with a high numerical aperture and, all in all, an imaging system is provided between mask and substrate which enables an imaging with high numerical aperture and is thus particularly well suited to reduce the size of the imaging structures.

BRIEF DESCRIPTION OF DRAWINGS

Embodiments of the invention are described in further detail herein below with reference to the accompanying drawings, wherein.

DETAILED DESCRIPTION

Figure 1:
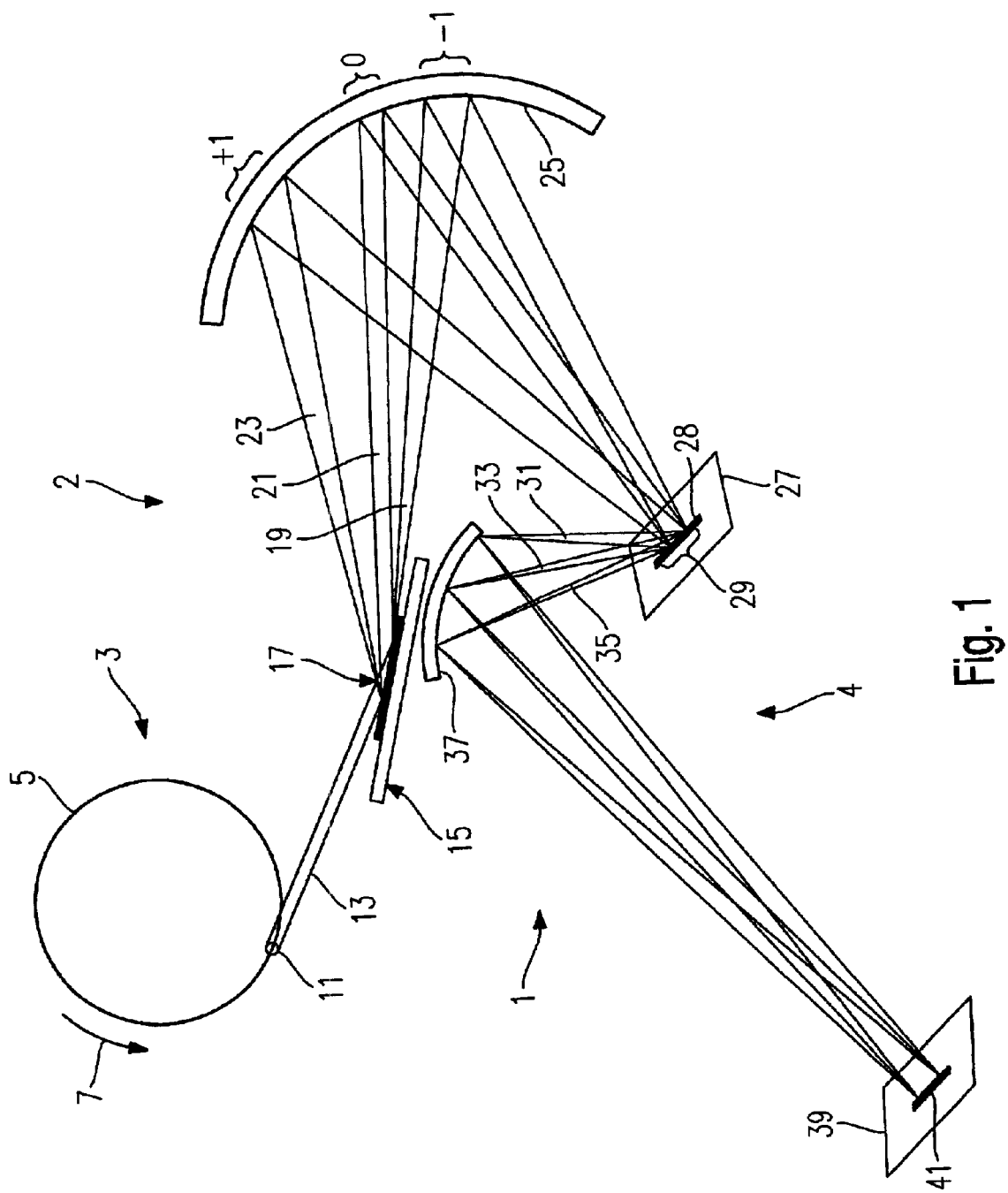
FIG. 1 shows an embodiment of an exposure system according to the invention.

FIG. 1 schematically depicts an embodiment of the exposure system 1 according to the invention which comprises an illumination system 2 and an imaging system 4. The illumination system 2 comprises a radiation source 3 in the form of a synchrotron, schematically represented in FIG. 1 as ring 5, in which electrons circulate in the direction of an arrow 7 and, thereby, emit synchrotron radiation. Synchrotron radiation emitted at a radiation position 11 is supplied as beam 13 to a diffraction-optical component 15. The beam can be supplied directly or indirectly, for example, by means of deflection mirrors, focusing components, wavelength-selective components etc. On the diffraction-optical component 15, there is provided an interaction region 17 to which at least a part of the beam 13 is directed so that, viewed from the interaction region 17, the radiation incident thereon appears to emerge directly from a source or a corresponding virtual source.

If wavelength-selective components, such as Bragg monochromators or the like, are provided in the beam path between the radiation position 11 and the interaction region 17, it is possible, by means of said components, to extract any possible wavelength spectrum of the synchrotron radiation and to supply the same to the interaction region 17. In particular, this is radiation with a radiation wavelength of from 0.1 nm to 100 nm, preferably 1 nm to 50 nm and, here, particularly wavelengths in the range around 13 nm.

In the interaction region 17, there is provided a grating structure which constitutes a reflection grating for the incident radiation 13. The incident radiation 13 is reflected at this grating structure and, as a result of grating diffraction, divided into three partial beams 19, 21, 23, namely beam 21 of the order 0, beam 23 of the order +1 and beam 19 of the order −1. Here, the divergence of the diffracted beams 19, 23 is determined by the frequency spectrum of the incident beam 13, because the diffraction angle, at a given grating period, is dependent upon the wavelength of the diffracted light.

The partial beams 19, 21 and 23 impinge on a condenser mirror 25 which has a focusing effect and reflects the partial beams and directs the same onto the surface of a mask 27. the partial beams 19, 21, 23 directed by the condenser 25 to the mask 27 jointly illuminate an extended illumination spot 29 on said mask. The mask 27 is a reflection mask supporting a structure, represented as straight line 28 in FIG. 1, at which the incident radiation 19, 21, 23 is reflected.

Viewed from the mask 27, it is illuminated by beams 19, 21, 23 impinging on the mask 27 from three different spatial directions. Accordingly, the beams 19, 21, 23 are also reflected by the structure 28 defined on the mask 27 into three different spatial directions as beams 31, 33, 35. The reflected beams are picked up by the imaging system 4 and imaged onto a substrate 39. The imaging system 4 comprises an objective mirror 37 on which the beams 31, 33, 35 impinge and which directs the same to the substrate 39 such that the structures of the mask 27 are imaged onto the substrate 39. In FIG. 1, the line structure 28 on the mask 27 is thus imaged onto the substrate 39 in that radiation impinges on the substrate 39 merely in the area of a line section 41.

All in all, the illumination system 2 provides an imaging system which images the mask 27 onto the substrate 39, the mask 27 being illuminated from several spatial directions although the beam 13 emerging from the source 11 is highly collimated. Proceeding from beam 13 which is incident with predetermined colinearity, there is thus provided an illumination system having a comparatively high numerical aperture or, in other words, the diffraction-optical component 15 contributes to increase the light-transmitting capability of the illumination system.

The grating structure provided by the diffraction-optical component 15 is adjustable by varying the grating period in order to change the diffraction angles of the beams 19 and 23 of the order −1 and +1, respectively. It is thus possible to vary the angles at which the beams 19, 23 strike the mask 27 also in terms of time so that a solid angle section for illuminating the mask 27 can be substantially fully illuminated over a period of time.

Apart from the described first diffraction order (+1, −1) of the incident beam, it is also possible to take higher diffraction orders (+2, −2, . . . ) for exposing the mask 27.

The illumination system 2 can be employed, for example, in a method for manufacturing a miniaturized device and therein, in particular, in a photolithographic process step. In this step, the substrate in which the device is to be formed is first coated with a radiation sensitive layer. The pattern of the mask 27 is then projected onto the radiation sensitive layer by means of the illumination system 2 of FIG. 1. Next, the radiation sensitive layer is developed and, subsequently, one or more processing steps are carried out to change the substrate, in sections, dependent upon whether the section is a section with developed or undeveloped photo-sensitive layer. Etching steps or doping steps etc., for example, can be such further processing steps.

The illumination system 2 is shown in FIG. 1 as simplified system in functional representation. Here, for example, the condenser and the objective each consist of one mirror 25 and 37, respectively. However, it is also possible to provide the components more complex and to insert further beam-shaping and beam-deflecting components into the beam path. Such components and the use thereof in a lithographic system is known, for example, from U.S. Pat. Nos. 5,973, 826, 6,033,079 and 6,142,641, the full disclosure of said documents being included into the present application by reference.

An essential component of the illumination system 2 shown in FIG. 1 is the diffraction-optical component 15, the incident beam 13 to be deflected impinging on the interaction region 17 of said diffraction component 15. Said diffraction-optical component is shown in further detail in FIG. 2. It comprises a substrate 43 with a substrate surface 45 on which surface waves with a high amplitude are efficiently excitable. The term surface waves, as used herein, is meant to embrace all wave phenomena in the substrate material which result into a periodic change of the optical properties of the substrate surface 45. These can be surface acoustic waves (SAW), in particular, Rayleigh waves or Love waves or Leck waves or density waves or shear respectively transverse waves or longitudinal waves etc., wherein surface waves polarized perpendicular to the surface of the substrate as well as surface waves polarized parallel to the surface, such as Bleustein-Gulyaev waves, can be utilized as transverse waves as well. Moreover, it is possible to use superpositions of such waves. In the following description, the surface acoustic waves (SAWs) are utilized to obtain the desired optical effect. However, it should be understood that other wave phenomena can be utilized as well to obtain the desired optical effects.

The substrate 43 is made from a monocrystal of lithium niobate ($LiNbO_3$) such that the substrate surface 45 forms a 128° rotY surface. The material lithium niobate was chosen as substrate material because it is a piezoelectric material and piezoelectric materials are particularly well suited for the excitation of surface waves by means of electric voltages or fields in a surface wave source 47. There are, however, also other piezoelectric materials which are suitable as substrate 43, such as lithium tantalate ($LiTaO_3$), quartz ($SiO_2$), lithium boron oxide (e.g., $Li_2B_4O_7$), aluminum phosphate ($AlPO_4$), gallium arsenide (GaAs), polybismuthite, in particular bismuth germanium oxide (e.g., $Bi_{12}GeO_{20}$ or $Bi_{12}SiO_{20}$) and others.

The surface wave source 47 comprises an electro-acoustic transducer 51 to which the energy required for producing the surface waves is supplied as electric energy at terminals 49 and 50.

The electro-acoustic transducer 51 is a unidirectional transducer. This means that the surface waves which propagate in a direction indicated by an arrow 53 are produced at a substantially higher intensity than surface waves which propagate in a direction 54 opposite to the direction 53.

Figure 3:
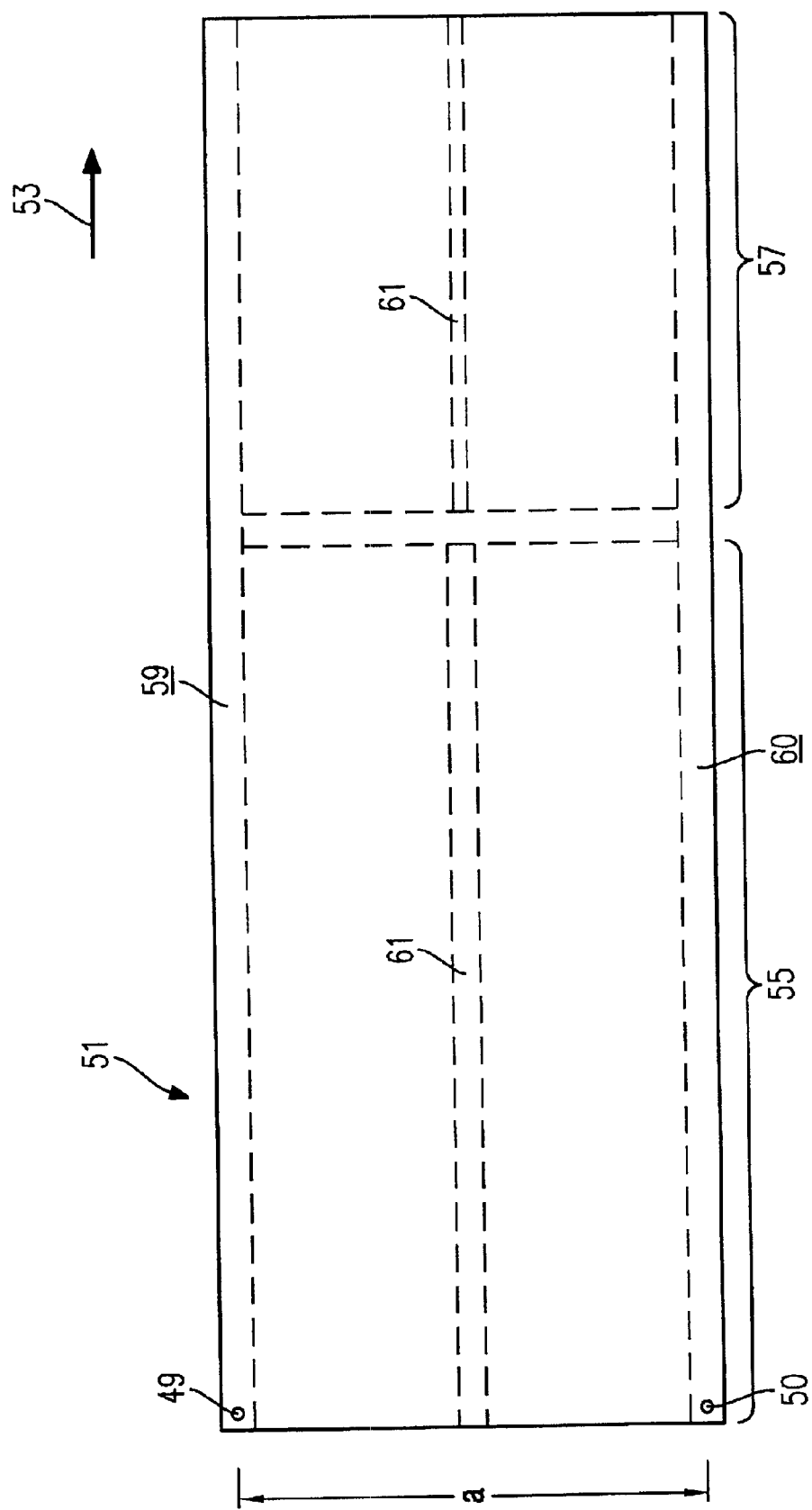
FIG. 3 is a schematic representation of a surface wave source for use in the diffraction-optical component of FIG. 2.
Figure 4:
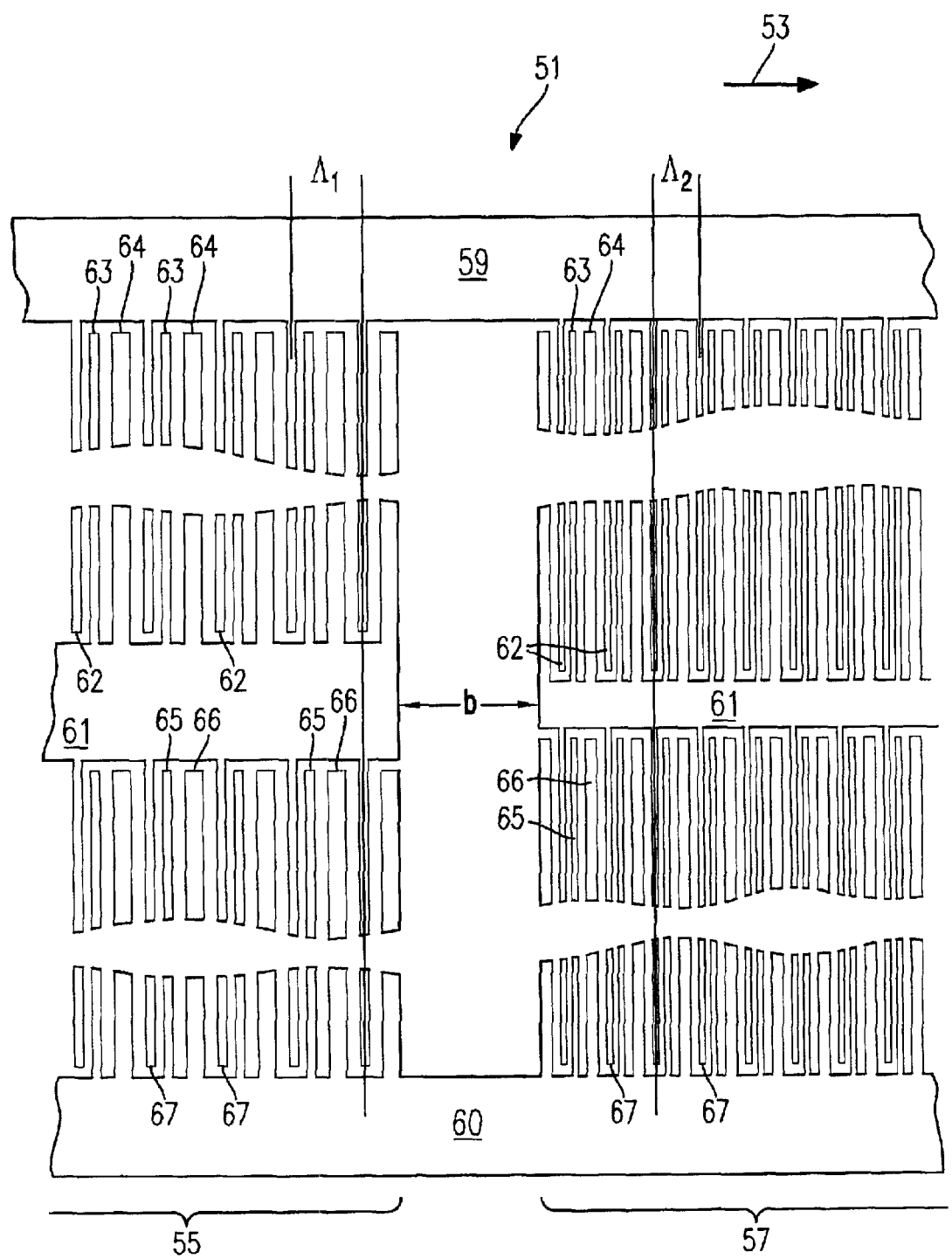
FIG. 4 is a detailed representation of the surface wave source of FIG. 3, FIG. 5 schematically shows graphs illustrating frequency dependencies of sub-components of the diffraction-optical component of FIG. 2, FIGS. 6, 7, 8, 9, 10, 11 and 12 show further embodiments of the diffraction-optical component according to the invention

As it is apparent from the detailed representations of FIGS. 3 and 4, the electro-acoustic transducer 51 comprises a sub-transducer 55 which is optimized to generate surface waves having a wavelength $\Lambda_1$ of 30 µm, as well as a sub-transducer 57 which is optimized to generate surface waves having a wavelength $\Lambda_2$ of 20 µm. However, it is also possible, by changing the distance between the finger electrodes, to provide the transducer for the emission of surface waves having other wavelengths Λ. In the present case, in particular, wavelengths Λ in the range of from about 2 µm to 100 µm, in particular, 4 µm to 50 µm at excitation frequencies of 50 MHz to 2 GHz are provided for.

Figure 5:
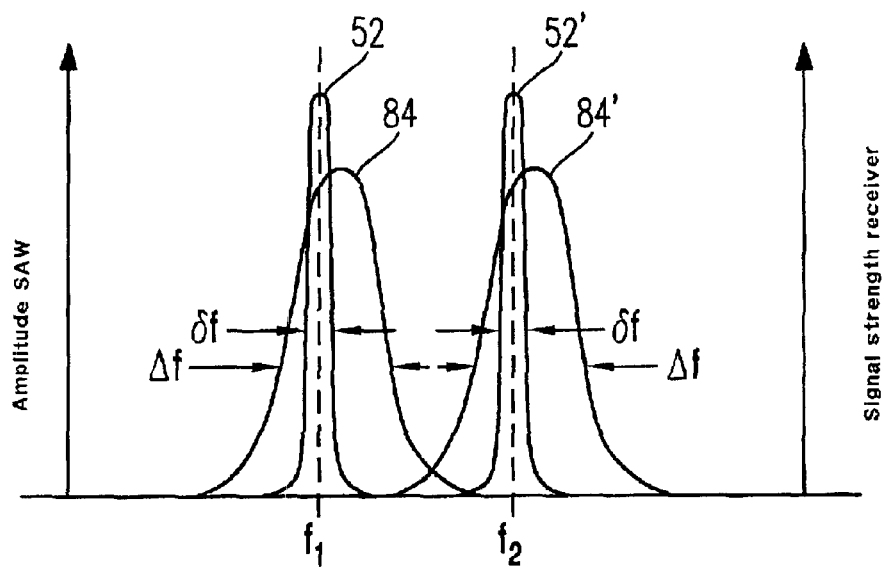

The curves 52 and 52' shown in FIG. 5 indicate a frequency characteristic of the electro-acoustic transducer 51. The curve 52 indicates the surface wave intensity emitted by the sub-transducer 55 in response to the electric excitation frequency of the transducer, while the curve 52' shows a corresponding representation for the sub-transducer 57. The two sub-transducers 55 and 57 generate surface waves at different frequencies $f_1$ and $f_2$, respectively, with maximum intensity. The high frequency $f_2$ is adjusted such that the sub-transducer 57 produces the surface waves with $\Lambda_2=20$ µm with maximum amplitude and emits the same into the direction 53, while, when being excited with the low frequency $f_1$, the sub-transducer 55 contributes to the generation of the surface waves with $\Lambda_1=30$ µm with maximum amplitude and emits the same likewise into the direction 53, the emitted surface waves passing through the sub-transducer 57.

The transducer 51 comprises a plurality of finger electrode sets, so-called interdigital electrodes, as it is evident from FIG. 4, which is an enlarged view of the area where the sub-transducers 55 and 57 of FIG. 3 are adjacent to one another.

The transducer 51 comprises a collecting electrode 59 at which the electric terminal 49 is provided and which extends in the direction of emission 53. A further collecting electrode 60 extends parallel to and spaced apart from the collecting electrode 59 by a distance a of about 1 mm, said second collecting electrode 60 being supplied by the terminal 50.

Each of the sub-transducers 55, 57 comprises an intermediate electrode 61 which extends centrally between the collecting electrodes 59 and 60, the intermediate electrode 61 of the sub-transducer 55 having a width of 50 µm and the collecting electrode 61 of the sub-transducer 57 having a width of 20 µm.

Finger electrodes 62, 63, 64, 65, 66 and 67 extend in each one of the sub-transducers 55, 57 perpendicular to the direction of emission 53 between the collecting electrode 59 and the intermediate electrode 61 and between the intermediate electrode 61 and the collecting electrode 60, respectively. Here, finger electrodes 62 emanate from the collecting electrode 59 and are spaced apart from each other by a center distance lambda, each having a width of $\Lambda_1/8$ and $\Lambda_2/8$, respectively, and terminating spaced apart from the intermediate electrode 61 by a distance of 5 µm. Between each pair of finger electrodes 62, there are disposed two finger electrodes 63 and 64, each of which emanates from the intermediate electrode 61 and terminates spaced apart from the collecting electrode 59 by a distance of likewise 5 µm. The finger electrode 64 has a width of $\Lambda_1/4$ and $\Lambda_2/4$, respectively, and is offset in the direction of emission 53 in respect of the finger electrode 63 and disposed directly adjacent to the finger electrode 63. The finger electrode 63 has a width of $\Lambda_1/8$ and $\Lambda_2/8$, respectively.

The structure of the finger electrodes 65, 66 und 67 extending between the intermediate electrode 61 and the collecting electrode 60 corresponds to the structure of the finger electrodes 62, 63 and 64 extending between the collecting electrode 59 and the intermediate electrode 61, in that the finger electrodes 67 are each in alignment with the finger electrodes 62, have a width of $\Lambda_1/8$ and $\Lambda_2/8$, respectively, and emanate from the intermediate electrode 61. The finger electrodes 65 have a width of likewise $\Lambda_1/8$ and $\Lambda_2/8$, respectively, emanate from the collecting electrode 60 and are each in alignment with the finger electrodes 63. The finger electrodes 66 have a width of $\Lambda_1/4$ and $\Lambda_2/4$, respectively, emanate from the collecting electrode 60 and are each in alignment with the finger electrodes 64.

Accordingly, each of the finger electrodes 62 emanating from the collecting electrode 59 is in alignment with a finger electrode 67 emanating from the intermediate electrode 61, and each one of the finger electrodes 65, 66 emanating from the collecting electrode 60 is in alignment with a corresponding finger electrode 63 and 64, respectively, extending from the intermediate electrode 61. However, the finger electrodes 62 emanating from the collecting electrode 59 are each disposed offset from the finger electrodes 65, 66 emanating from the collecting electrode 60.

By arranging the finger electrodes in this way, a serial connection is provided, in which the transducer sections disposed between the collecting electrode 59 and the intermediate electrode 61 are electrically connected in series to the transducer sections disposed between the intermediate electrode 61 and the collecting electrode 60. This results into a voltage division, so that only half of the voltage which, in operation, is applied to the terminals 49 and 50 is applied between adjacent pairs of sub-electrodes (62-63, 64-62, 67-65, 66-67).

The sub-transducers 55 and 57 are spaced apart from one another by a distance b of 53,7 µm, i.e., the area between the sub-transducers 55, 57 which is not provided with electrodes has this width b.

In the direction of emission 53, the sub-transducer 55 has a length of 60 $\Lambda_1$ ($\Lambda_1$=30 µm) and the transducer 57 has a length of 50 $\Lambda_2$ ($\Lambda_2$=20 µm).

The described electrode structure is formed on the substrate surface by depositing an aluminum film, the spaces between the individual electrodes being subsequently etched out in micro-lithographic processes. As an alternative to the formation of the electrode structure of aluminum, it is also possible to use other elements, in particular, metals, such as copper.

The surface wave source 47 is supplied by an amplifier 71 which is connected to the terminals 49 and 50. The surface waves emitted by the surface wave source 47 in the direction 53 pass through the interaction region 17 and produce there the radiation-diffracting grating structure required for deflecting the incident beam 13. In order to obtain a diffraction efficiency as high as possible, the electric energy supplied to the source 47 by the amplifier 71 and the frequency f used for this purpose is to be adjusted, at a given wavelength $\Lambda$ of the surface waves, such that the grating amplitude, i.e., the amplitude of the surface waves in the interaction region 17, is as high as possible.

To this end, the diffraction-optical component 15 furthermore comprises a surface wave receiver 73 which is likewise disposed in the propagation path of the surface waves emitted by the source 47 and which the surface waves strike after having passed through the interaction region 17. The surface wave receiver 73 comprises an acousto-electric transducer which converts mechanical energy of the surface waves into electric energy and supplies the same to terminals 75 and 76.

Figure 2:
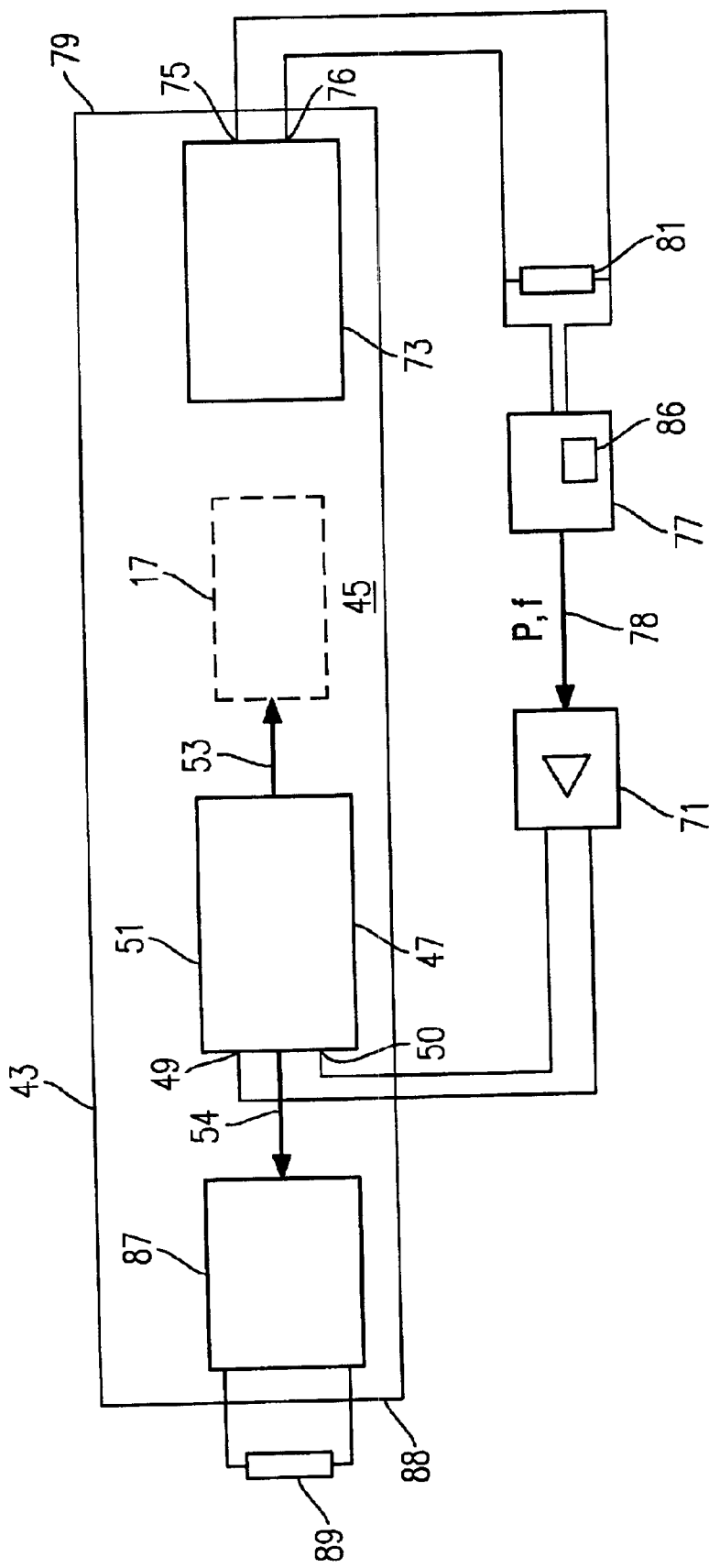
FIG. 2 shows an embodiment of a diffraction-optical component according to the invention.

The voltage between the terminals 75 and 76 is thus a signal representing the intensity of the surface waves at the location of the receiver 73 and is detected by a control means 77. The control means 77, in turn, acts on the amplifier 71, as shown in FIG. 2 by the arrow 78, and determines the power and frequency for the same to be supplied to the source 47. The control means 77 varies the quantities power P and frequency f such that the signal taken off at the terminals 75 and 76 is at a maximum. As it may be assumed that the amplitude of the surface waves is maximal in the interaction region 17 when the receiver 73 likewise detects maximal surface wave amplitudes, said control means causes the source 47 to be driven such that the surface wave amplitude in the interaction region 17 is maximal as well.

The construction of the acousto-electric transducer of the receiver 73 is similar to that of the electro-acoustic transducer 51 of the source 47, i.e., the acousto-electric transducer likewise comprises a plurality of finger electrodes or interdigital electrodes which are connected to the terminals 75 and 76. In the embodiment of FIG. 2, the acousto-electric transducer of the receiver 73 has an electrode structure which substantially corresponds to that of the electro-acoustic transducer 51. However, it differs therefrom in that its structure is symmetric in respect of a central plane between the source 47 and the receiver 73, so that electrodes of the receiver 73 which correspond to the wide finger electrodes 64, 66 of the source 47 are disposed, in the direction of emission 53, besides the respective adjacent narrow electrodes which corresponds to the electrodes 63, 65. This imparts a unidirectional characteristic to the receiver 73 as well, i.e., it receives surface waves propagating in direction 53 with higher efficiency than surface waves which propagate in a direction opposite thereto.

Apart from controlling the power P and frequency f to be supplied to the source 47, the surface wave receiver 73 also serves as surface wave damper. This is because surface waves which, after having traversed the interaction region 17, propagate further on the substrate are at least partially reflected at an edge 79 of the substrate 43 and can thus be returned into the interaction region 17 where they would interfere with the grating structure defined by the surface waves and diminish the quality of the beam deflection achieved. Therefore, it is an aim to completely absorb the surface waves in the receiver 73, if possible, so that substantially no surface wave intensity reaches the edge 79 of the substrate 43 and is reflected there.

To this end, the receiver 73 is optimized to the effect that it converts as much of the mechanical energy of the surface waves as possible into electric energy, said electric energy being discharged via lines connected to the terminals 75 and 76 and dissipated in a resistor 81. The resistor 81 is connected remote from the substrate so that the substrate 43 and, in particular, the interaction region 17 are not heated up by the heat produced in the resistor 81 and the optical effect of the surface waves is not impaired by temperature influences. In order for the electric energy applied to the terminals 75 and 76 of the receiver 73 to be dissipated in the resistor 81 as efficiently as possible, the resistor is not provided as purely ohmic resistor but as complex impedance, the impedance value of which is adjusted to the impedance of the receiver 73 in that the impedance values of the resistor 81 and the receiver 73 are substantially conjugate-complex impedance values.

In the embodiment shown in FIG. 2, the functions of the receiver 73, namely to provide a measuring signal for controlling the source 47, on the one hand, and to dampen the surface waves which have traversed the interaction region 17, on the other hand, are combined in one device. However, it is also possible to separate these functions in separate devices and to dispose the receiver for providing the measuring signal for controlling the source 47, in propagation direction 53, in front of a further component which merely functions as surface wave damper.

As is evident from FIG. 5, the source 47 has a narrow-band frequency characteristic 52, 52', i.e., at the frequency f, an intensity of the emitted surface waves drops, in response to the excitation frequency, on both sides of a maximum with a characteristic width δf.

FIG. 5 likewise indicates the frequency characteristic of the surface wave receiver 73 as lines 84 and 84' representing the magnitude of the measuring signal supplied to the terminals 75 and 76 in response to the frequency of the entering surface waves. The lines 84 and 84' likewise drop on both sides of a medium frequency with a width Δf. As is evident from FIG. 5, the characteristic frequency widths Δf of the receiver 73 are greater than the frequency widths δf of the source 47. As a result, the receiver 73 is insensitive to slight frequency changes of the source 47 so that, within a certain frequency range, the control means 77 can control the source 47 solely in response to the measuring signal at the terminals 75, 76 to attain a maximum amplitude of the surface waves in the interaction region 17.

In the present embodiment, however, the control means 77 comprises an additional memory 86 in which the frequency-dependent sensitivity of the receiver 73, i.e., the shape of the curve 84 of FIG. 5, is stored. This enables a reliable control of the source 47 also at frequencies which are further remote from the medium frequency of the line 84, as it is shown in FIG. 5 for the excitation frequency f3.

The frequency widths Δf of the surface wave receiver 73 which are enlarged as compared to that of the surface wave source 47 are attained in that for the acousto-electric transducer of the receiver 73, on principle, the same electrode structure is selected as for the electro-acoustic transducer of the source 47. In so far, the acousto-electric transducer of the receiver 73 has the same electrode structure as it is shown in FIG. 4 for the acousto-electric transducer 51 of the source. However, the transducer of the source 73 is provided shorter in the direction 53 than the transducer of the source 47. This means that the transducer of the receiver 73 has less finger electrodes than the transducer of the source 47. In the present embodiment, the one sub-transducer of the acousto-electric transducer of the receiver 73 has a length of 40 $\Lambda_1$ and the other sub-transducer has a length of 35 $\Lambda_2$.

A further difference between the electrode structure of the transducer of the source 47 and that of the transducer of the receiver 73 resides in the distance of the electrode fingers from each other. During operation, the substrate has a higher temperature in the surrounding of the source 47 than it has in the surrounding of the receiver 73. This results into a difference in the wavelengths of the surface waves at the location of the source 47 and the location of the receiver 73. At the location of the receiver 73 the wavelength is shorter by about 0.5% than at the location of the source 47. Therefore, the structure of the transducer in the receiver 73 is geometrically scaled down by 0.5% as compared to the transducer in the source 47, so that for the dimensioning of the transducer in the receiver 73 29.85 μm is taken as parameter $\Lambda_1$ and 19.9 μm as parameter $\Lambda_2$. Therefore, the medium frequencies of the frequency characteristics 84 and 84' are slightly offset to higher frequencies as compared to the frequencies $f_1$ and $f_2$, respectively. In this respect, FIG. 5 shows the frequency characteristics 52 52', 84, 84' in a measurement in which the source 47 and the receiver 73 have the same temperature, so that the difference between the medium frequency of the frequency characteristics becomes apparent. During continuous operation, there is a temperature difference between the source 47 and the receiver 73 of about 70K, so that, then, the medium frequencies of the characteristics 52 and 84 and 52' and 84', respectively, approximately coincide.

As the surface wave source 47 does not exhibit a perfect unidirectional characteristic and, therefore, also emits surface waves in the direction 54 with a certain intensity, a further surface wave damper 87 is provided in the direction 54 next to the source 47, in order for these surface waves which have been emitted in the direction 54 to be absorbed and the reflection of the same at an edge 88 of the substrate 43 back to the interaction region 17 to be prevented. The surface wave damper 87 is also provided as acousto-electric transducer which converts the mechanical energy of the surface waves into electric energy which is dissipated in an accordingly adjusted resistor 89.

Besides the electro-acoustic transducer described with reference to FIGS. 3 and 4, it is also possible to use other transducer types with unidirectional characteristic. So-called one-phase as well as multiple-phase surface wave generators come into consideration. Examples in this respect are inferable, for example, from U.S. Pat. Nos. 4,521,711, 4,736,172, 4,910,839, 5,073,763, 5,162,689, 5,264,751, 5,365,206 and 6,147,574, the entire disclosures of which are incorporated into the present application by reference.

Variants of the embodiments described with reference to FIGS. 1 to 5 will now be described in further detail. Components which correspond to each other in structure and function are designated herein below by the same reference numbers as used in FIGS. 1 to 5, but, for the purpose of distinction, are supplemented by an additional letter. For the purpose of illustration, reference is made to the entire above description.

Figure 6:
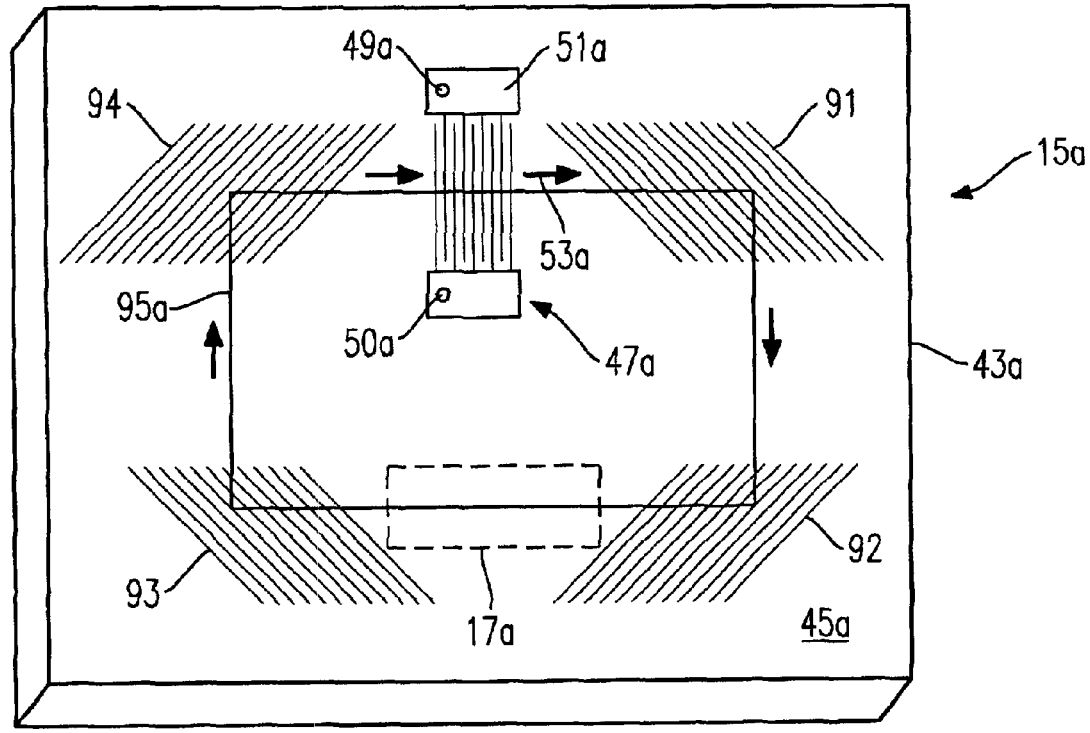

FIG. 6 shows a further embodiment of a diffraction-optical component 15a which comprises a substrate 43a of piezoelectric material with a substrate surface 45a. On the substrate surface 45a, there is disposed a surface wave source 47a which is provided as electro-acoustic transducer with terminals 49a and 50a. The interdigital electrodes of the electro-acoustic transducer are shown merely schematically in FIG. 6.

The electro-acoustic transducer 51a, too, has a unidirectional characteristic, so that it emits surface waves preferably into a direction designated by an arrow 53a.

The surface waves emitted by the source 47a first impinge on a surface wave mirror 91 symbolized by a line grating in FIG. 6, they are deflected by the same through an angle of 90° from their original direction of propagation 53a, then impinge successively on further surface mirrors 92, 93 and 94, each reflecting the same through an angle of 90° and being positioned on the substrate 45a such that the surface waves, after having been reflected at the last mirror 94, again extend in their original direction of propagation 53a and travel towards the source 47a. The mirrors 91 to 94 thus define a ring-type closed propagation path 95a for the surface waves, the source 47a being disposed in said closed propagation path and feeding surface waves into said propagation path.

In the propagation path between the mirrors 92 and 93, there is disposed an interaction region 17a which is provided for the structure formed by the surface waves in this region to interact with incident radiation to be deflected or diffracted.

As compared to the embodiment of the diffraction-optical component shown in FIG. 2, the embodiment shown in FIG. 6 is advantageous in so far as the surface waves which have traversed the interaction region 17a are not absorbed and thus their energy is not destroyed. Rather, the surface waves remain stored in the ring-type closed propagation path 95a on the substrate 45a and can again contribute to the formation of the grating structure in the interaction region 17a. Here, the source 47a is advantageously driven by a control means, not shown in FIG. 6, such that the surface waves supplied by the mirror 94 to the source 47a and the surface waves produced by the source 47a itself are constructively superposed.

Similar to the embodiment shown in FIG. 2, a surface wave receiver may also be provided in the closed propagation path 95a of the surface waves to optimally drive the surface wave source 47a.

The mirrors 91, 92, 93, 94 are provided as Bragg mirrors with a line grating, the lines being formed by grooves etched into the substrate surface 45a. However, it is also possible to provide the grating lines by metallizing films which are deposited on the substrate surface.

Figure 7:
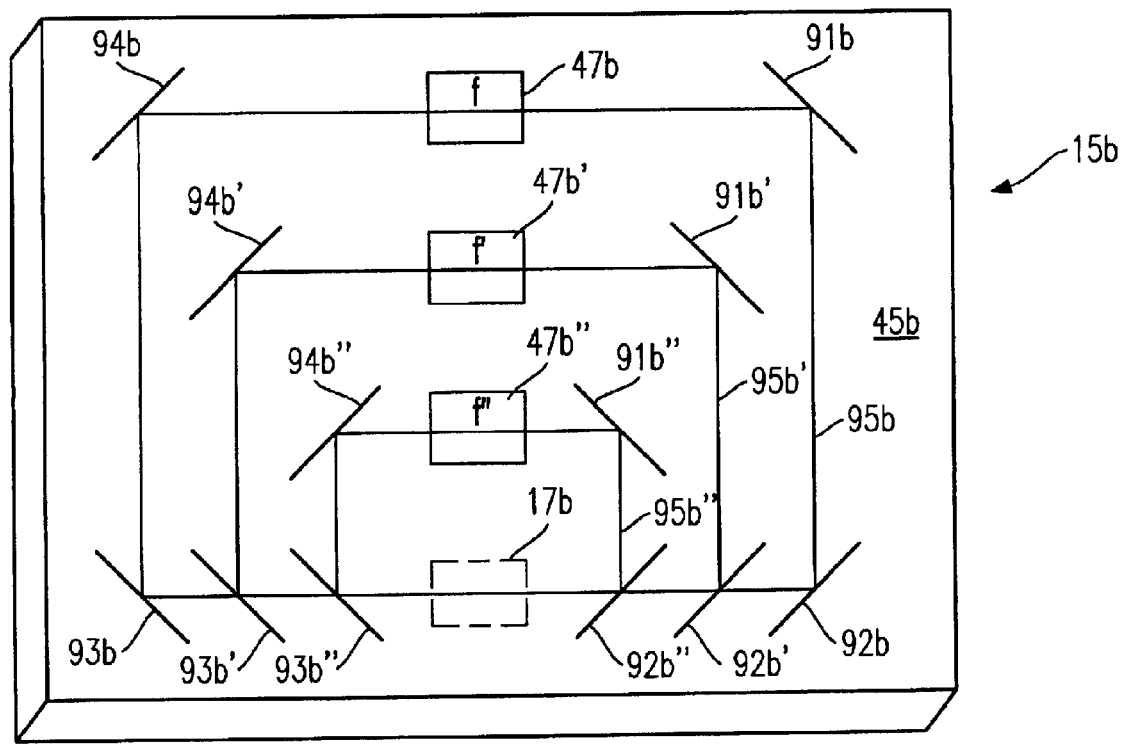

FIG. 7 shows a substrate surface 45b of a diffraction-optical component 15b, wherein a surface wave source 47b emits surface waves having a frequency $f_1$ into a preferred direction 53b. Via mirrors 91b, 92b, 93b and 94b, there is provided a closed propagation path 95b for the surface waves of the frequency $f_0$, so that the surface waves, after having passed through the closed propagation path 95b, eventually traverse the surface wave source 47b again and are amplified there, in similar way as it has already been described with reference to the embodiment of FIG. 6. An interaction region for radiation to be deflected or diffracted is provided between the mirrors 92b and 93b.

In addition to the surface wave source 47b, there are provided two further surface wave sources 47b' and 47b" on the substrate which emit surface waves of frequencies f' and f", respectively, the frequencies f' and f" being different from each other and from the frequency f of the source 47b. A closed propagation path 95b' and 95b" for surface waves is likewise provided on the substrate for each one of the sources 47b' and 47b", respectively, namely by mirrors 91b', 92b', 93b', 94b' and 91b", 92b", 93b", 94b", respectively.

The closed propagation paths 95b, 95b', 95b" for surface waves of the frequencies f, f', f" jointly traverse the interaction region 17b and are subsequently separated by the mirrors 93b", 93b' and 93b to be again supplied to the surface wave sources 47b, 47b', 47b" for the frequencies f, f' and f", respectively. Here, the mirror 93b" reflects surface waves of the frequency f", while it is transparent for surface waves of the frequencies f' and f. Equally, mirror 93b' reflects surface waves of the frequency f', while it is likewise transparent for surface waves of the frequency f. The propagation paths, which have been separated after traversal of the respective sources 47b, 47b' and 47b", are united by the mirrors 92b, 92b' and 92b", with mirrors 92b' and 92b" being transparent for the surface waves of the frequency f and the mirror 92b" being likewise transparent for surface waves of the frequency f and f'.

Each of the sources 47b, 47b' and 47b" emits surface waves in a frequency spectrum which is variable over a certain range depending on the drive frequency for the source. However, the frequencies f, f' and f" at which the sources emit with highest efficiency are different from each other (f"<f'<f), so that, by selectively driving the three different sources, a comparatively wide frequency spectrum of surface waves can be provided in the interaction region 17b. Accordingly, the deflection angles which can be produced for the incident radiation by the grating structure formed by the surface waves are variable over a particularly wide range.

The sources 47b, 47b' and 47b" can be driven sequentially in time such that the different deflection angles are provided successively in time, as well. Equally, the sources 47b, 47b' and 47b" can be driven simultaneously so that the superposition of the corresponding surface waves with different wavelengths results into a multiple grating which simultaneously provides the different deflection angles. By a superposition of the surface waves of the frequencies f, f' and f" in proper phase relation and suitable selection of these frequencies, it is possible to superpose the same such that a periodic grating structure is obtained which differs from the sinusoidal grating structure. In particular, a so-called blazed grating can thus be provided, wherein specific diffraction orders are deliberately produced with higher diffraction intensity than other diffraction orders.

As an alternative to the three surface wave sources 47b, 47b' and 47b" shown in FIG. 7, it is also possible to likewise provide two or four or more surface wave sources, each having a closed propagation path, said separate propagation paths, however, being disposed such that they jointly traverse the interaction region.

Alternatively, it is also possible to provide several surface wave sources disposed adjacent to one another, the propagation paths of which are united in the interaction region, in similar way as shown in FIG. 7 by the mirrors 92b, 92b' and 92b", but not to return the surface waves, after the same have traversed the interaction region, to the sources.

Figure 8:
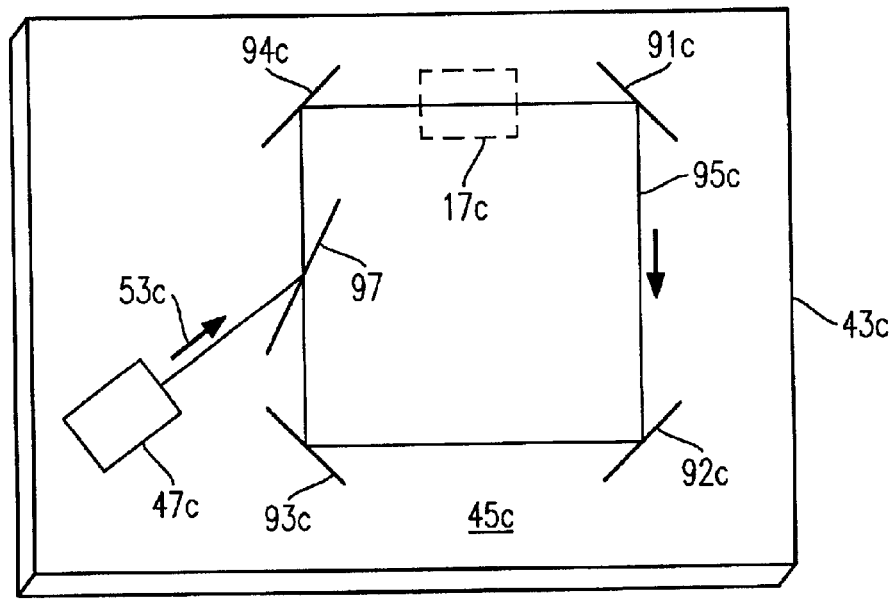

In the embodiments of FIGS. 6 and 7, closed propagation paths for the surface waves are provided, the surface wave sources being disposed within the closed propagation paths. As against that, FIG. 8 shows an embodiment, wherein a closed propagation path 95c is provided on a surface 45c of a substrate 43c by mirrors 91c, 92c, 93c, 94c, an interaction region 17c for incident radiation being disposed between the mirrors 94c and 91c, said interaction region being traversed by said propagation path 95c.

A surface wave source 47c is disposed outside of the closed propagation path 95c and emits surface waves in a preferred direction 53c. The surface wave source 47 is disposed on the substrate surface 45c such that the surface waves emitted from the same impinge on a mirror 97 which is disposed between the mirrors 93c and 94c in the propagation path 95c. The mirror 97 is oriented such that it directs the surface waves emitted by the source 47c in the direction 53c to the mirror 94c and thus superposes the same on the surface waves already traveling on the closed propagation path 95c. The mirror 97 is substantially transparent for the surface waves emerging from the mirror 93c.

By mirrors 91c to 94c, there is thus provided a ring resonator for surface waves which is supplied with surface waves by the source 47c which are fed into the ring resonator by means of the mirror 97c.

Figure 9:
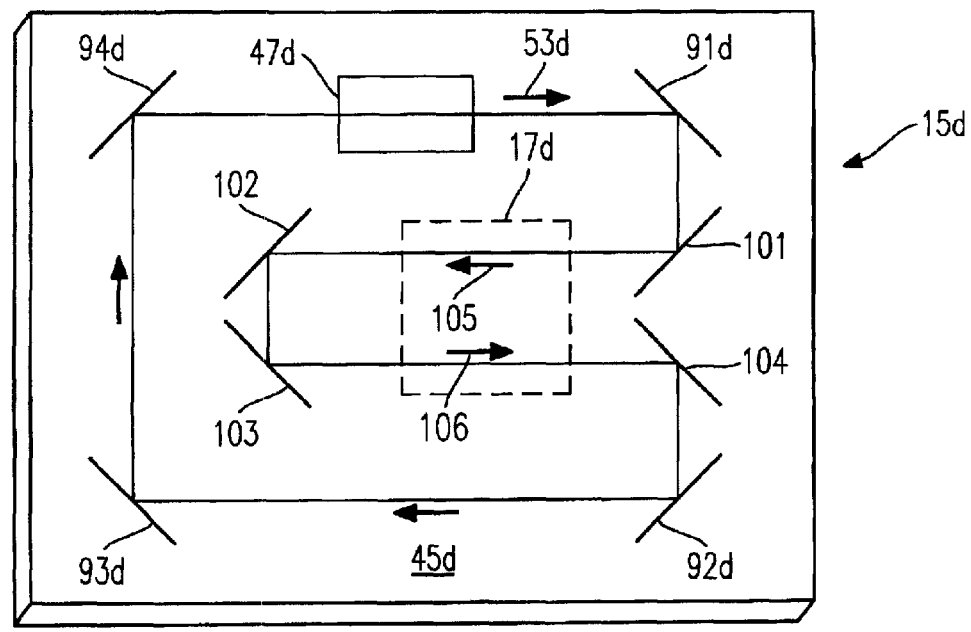

FIG. 9 shows a diffraction-optical component 15d having a substrate surface 45d on which an interaction region 17d is provided for deflecting radiation by means of surface waves. The surface waves are emitted by a source 47d into a preferred direction 53d. The surface waves emitted by the source 47d impinge successively on mirrors 91d, 101, 102, 103, 104, 92d, 93d and 94d. The interaction region is disposed between the mirrors 102 and 103, on the one hand, and mirrors 101 and 104, on the other hand, and is thus traversed twice by the surface waves, namely in a direction 105 of the surface waves extending from the mirror 101 to the mirror 102, on the one hand, and in a direction 106 of the surface waves extending from the mirror 103 to the mirror 104, on the other hand, said direction 106 being opposite to the direction 105.

Figure 10:
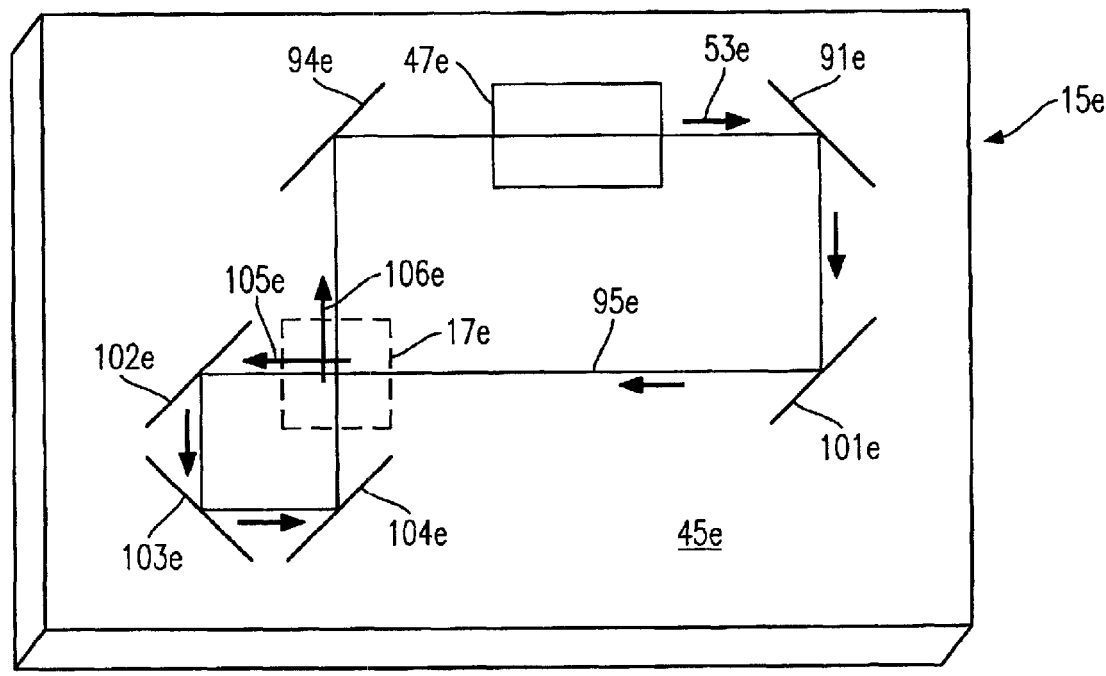

FIG. 10 shows a further diffraction-optical component 15e, wherein surface waves emitted by a surface wave source 47e in a direction 53e likewise travel on a substrate surface in a closed propagation path 95e. Similar to the embodiment of FIG. 9, here, too, an interaction region 17e is traversed by the surface waves in two different directions 105e and 106e, which, however, in contrast to the embodiment of FIG. 9, do not extend oppositely but orthogonally to each other. To this end, the surface waves emitted by the source 47e are successively reflected at mirrors 91e, 101e, 102e, 103e, 104e and 94e before they are returned to the source 47e, as it is evident from FIG. 10.

As the interaction region 17e is traversed by surface waves in two directions 105e and 106e extending orthogonally to each other, a two-dimensional grating structure is formed there by the surface waves. As a result, the radiation incident on the interaction region 17a is deflected into two spatial directions.

Figure 11:
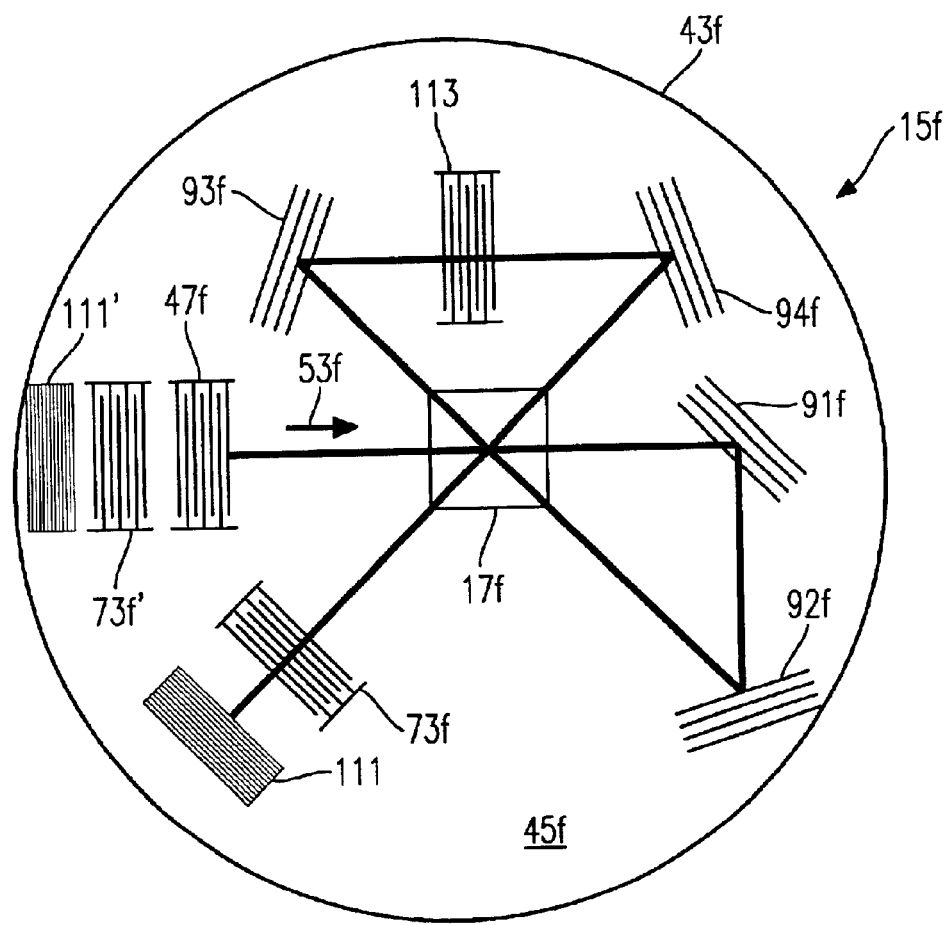

FIG. 11 shows a diffraction-optical component 15f with a substrate 43f, an interaction region 17f being provided on the substrate surface 45f thereof. The interaction region is traversed several times by a beam of surface waves in different directions. To this end, a surface wave source 47f emits surface waves into a preferred direction 53f directly onto the interaction region 17f. After having traversed the interaction region 17f, the surface wave beam is then deflected through 90° at a mirror 91f, impinges on a further mirror 92, is deflected by the same through 135° and again traverses the interaction region 17f, namely in a direction which is turned 135° in respect of the direction 53f of the first traversal of the interaction region. After having traversed the interaction region 17f again, the beam impinges on a further mirror 93f, is deflected by the same through 135°, receiver 73f which delivers a signal representing the intensity of the surface waves after the third traversal of the interaction region 17f. After having traversed the receiver 73f, the beam is absorbed in a separate surface wave damper 111.

Adjacent to the surface wave source 47f, there is provided a further surface wave damper 73f' which receives the surface waves emitted by the source 47f in the direction opposite to the preferred direction 53f. After having traversed the receiver 73f', these waves are then likewise absorbed by a surface wave damper 111'.

A further surface wave source 113 is provided in the propagation path of the surface waves between the mirrors 93f and 94f, which surface wave source is traversed by the surface waves after having passed through the interaction region 17f a second time and which can increase the intensity of these surface waves such that an adjustable higher intensity of surface waves is available for the third traversal of the interaction region 17f.

A control means for this diffraction-optical component 15f can read out the output signals of the surface wave receiver 73f and 73f' in order to adjust the power or source strength of the two sources 47f and 113 absolutely and relative to one another, namely in respect of a desired grating structure provided by the surface waves in the interaction region 17f. Here, the intensity of the two surface wave sources 47f and 113 can be varied relative to one another in order to influence the diffraction efficiency in different spatial directions.

Figure 12:
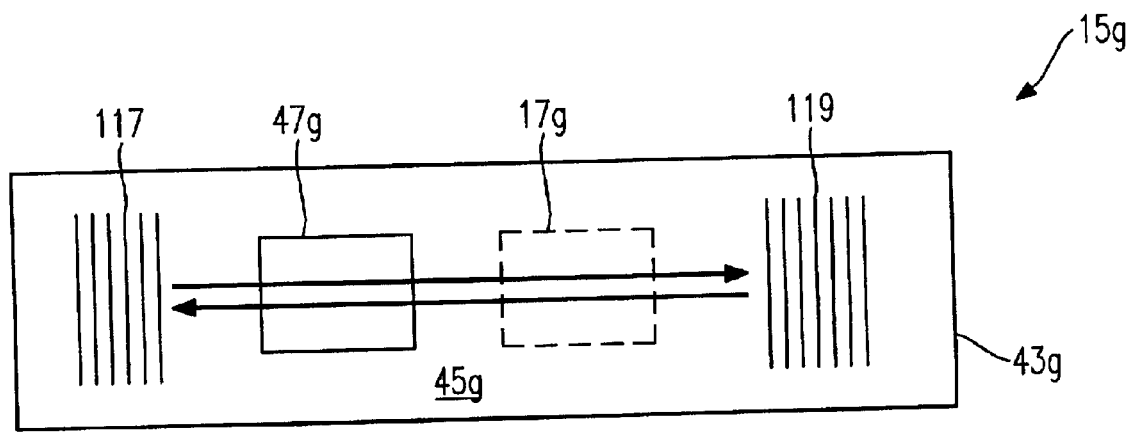

A diffraction-optical component 15g shown in FIG. 12 comprises a substrate 43g having an interaction region 17g on the surface 45g thereof, said interaction region being disposed within a surface wave resonator in which standing surface waves can be produced. To this end, two oppositely disposed surface wave mirrors 117 and 119 are disposed on the substrate surface, wherein surface waves of a predetermined frequency band can reciprocate between said mirrors and can form a standing surface wave field there. Between the two resonator mirrors 117, 119, there is disposed the interaction region 17g as well as a surface wave source 47g which supplies the resonator with surface waves.

The interaction region 17g is illuminated by a continuous light beam which thus sees a grating structure in the interaction region, the grating amplitude of which increases and decreases alternating in time with double the frequency of the surface waves. The diffraction efficiency provided by this grating changes accordingly with double the frequency of the surface waves.

Figure 13:
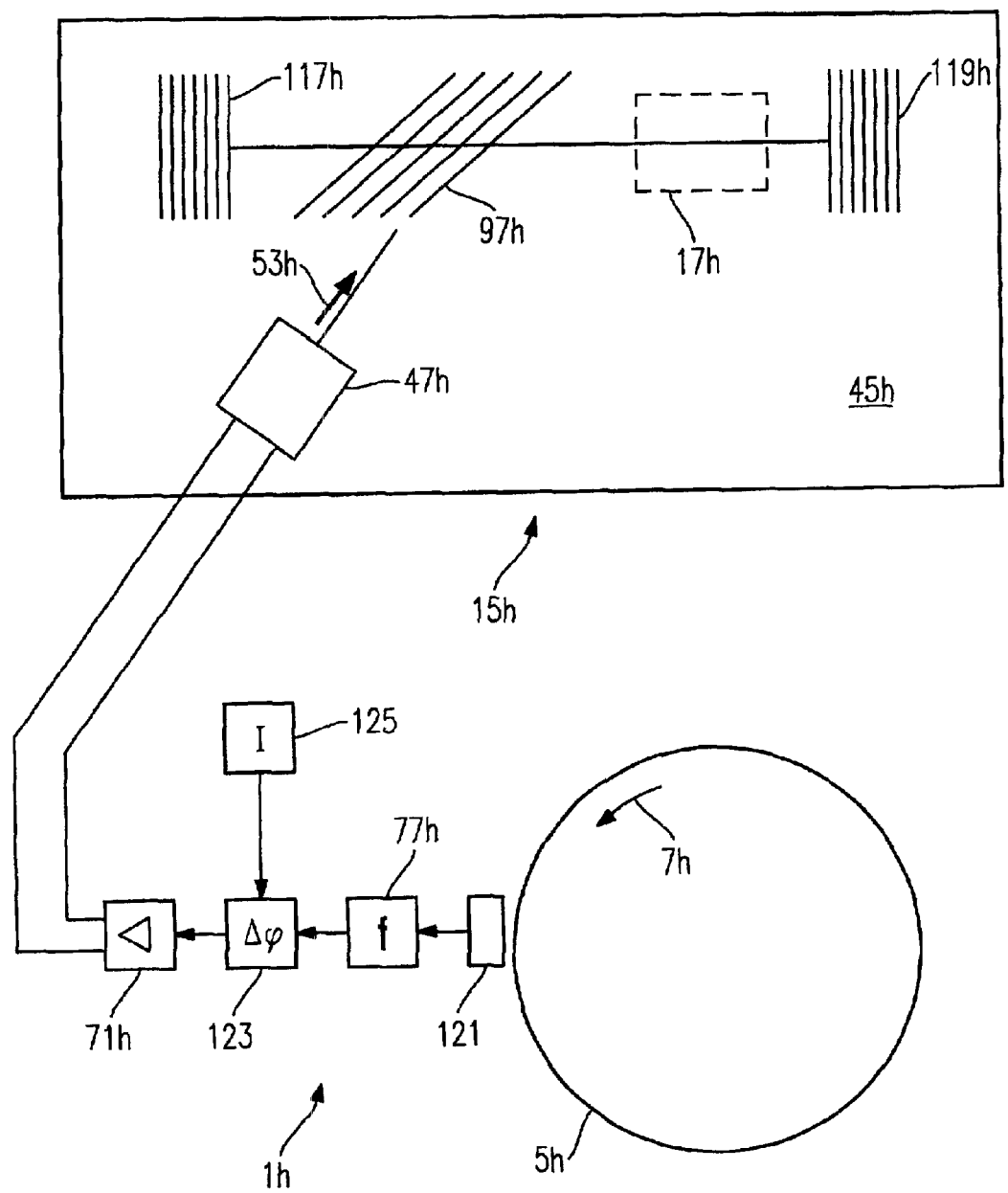
FIG. 13 shows a further embodiment of the illumination system according to the invention.

FIG. 13 shows a further diffraction-optical component 15h, wherein standing surface waves are produced in an interaction region 17h on a substrate surface 45h by means of two mirrors 117h and 119h facing each other. In contrast to the embodiment shown in FIG. 12, here, a surface wave source 47h is provided, however, not within the resonator but outside the same, with surface waves emitted by the source 47h into a preferred direction 53h impinging on a feed-in mirror 97h which is disposed within the resonator, i.e., between the two mirrors 117h and 119h, and feeds the surface waves emitted by the source 47h into the resonator where a field of standing surface waves is formed.

The diffraction-optical component 15h shown in FIG. 13 is part of an illumination system 2h which comprises a synchrotron radiation source 5h as light source shown merely schematically in FIG. 13. In the synchrotron 5h bundles of charged particles travel in the direction of the arrow 7h and thus emit time-pulsed synchrotron radiation at a radiation position, not shown in FIG. 13, which is directed to the interaction region 17h. Here, a control means is provided, which will be described herein below, for synchronizing the surface wave source 47h and the synchrotron 5h such that the radiation pulses emitted by the synchrotron 5h impinge on the interaction region 17h whenever the amplitude of the surface wave grating is substantially maximal in order to deflect an intensity as high as possible of the available synchrotron radiation with maximum diffraction efficiency.

To this end, a sensor 121 is provided at the synchrotron 5h for delivering a measuring signal representing the time sequence of the particle packages traveling in the synchrotron and thus the time sequence of the radiation pulses. The sensor 121 may be, for example, a beam pick-up coil or the like.

The measuring signal provided by the sensor 121 is supplied to a frequency control means 77h which determines the frequency of the surface waves emitted by the surface wave source 47h, the frequency f of the surface waves being adjusted to half of the frequency of the radiation pulses. The frequency signal delivered by the frequency control means 77h is supplied to a phase shift control means 123 which adjusts a phase $\Delta\phi$ of the surface waves emitted by the source 47h and then drives an amplifier 71a, the output of which, in turn, is supplied to the surface wave source 47h. The phase shift control means 123 adjusts the phase $\Delta\phi$ in response to a signal recorded by a radiation sensor 125. The radiation sensor 125 measures the intensity of a predetermined diffraction order of the radiation incident on the interaction region 17h. As the intensity of this radiation is dependent upon the diffraction efficiency of the diffraction grating provided by the surface waves in the interaction region 17h, the measuring signal delivered by the radiation sensor 125 represents the diffraction efficiency of the grating. The phase shift control means 123 then adjusts the phase $\Delta\phi$ such that the diffraction efficiency is maximal.

The phase shift control means 123 can also be employed to switch off the diffracted beam, i.e., to adjust the phase $\Delta\phi$ such that the diffraction efficiency is minimal. For example, this can be accomplished in that the phase $\Delta\phi$ p is adjusted such that the radiation pulses impinge on the interaction region whenever the amplitude of the standing waves has a value there which is substantially Zero.

In this respect, it is also possible to employ for the frequency of the surface waves a multiple of the above-described frequency f, i.e., the basic frequency of the radiation pulses or the harmonics of the same.

In the above-described embodiment, the phase shift control means 123 is driven such that surface waves emitted by the surface wave source 47h are fed into the surface wave resonator formed by the mirrors 117h and 119h in proper phase relation. The phase shift control means 123 adjusts the phase angel $\Delta\phi$ in response to the radiation intensity sensor 125. The radiation sensor 125 can detect the intensity of the radiation diffracted at first or second or higher order.

Alternatively, it is, however, also possible for the phase shift control means 123 to adjust the phase angle $\Delta\phi$ not in response to a measuring signal of a radiation sensor, but in response to a measuring signal which is provided by a surface wave receiver which detects the amplitude of the surface waves occurring in the surface wave resonator.

Such an adjustment of the phase position of a surface wave source by means of a phase shift control in response to the measuring signal of a radiation sensor or a surface wave receiver is applicable to all of the above-described embodiments, wherein either standing surface waves or surface waves circulating in a closed propagation path are produced.

It is also possible to illuminate the interaction region of the resonator shown in FIG. 13, i.e., a resonator which is supplied by an external surface wave source, by means of a continuous radiation source, as it has been described for the embodiment of FIG. 12, and it is also possible to illuminate the interaction region of the embodiment of FIG. 12 with a pulsed illumination source which is synchronized with the standing surface waves, as it has been described with reference to the embodiment shown in FIG. 13.

In the above-described embodiments, propagation directions of the surface waves are mostly deflected through 90° in respect of their original propagation direction by means of mirrors which are disposed at an angle of 45° in respect of the original propagation direction of the surface waves. This representation has been selected for the purpose of simplicity. It should, however, be noted that the propagation of surface waves is often influenced and determined by anisotropic effects in the material of the substrate. Therefore, it is possible that the angular relationship known in optics between entering and exiting beam which is reflected at a mirror is not fulfilled here with surface waves. Accordingly, an angle of incidence of surface waves on a mirror is not always equal to the corresponding exit angle. It is also possible that surface waves propagate on a substrate, on which they propagate in a first direction with comparatively little dampening, in a direction orthogonal thereto poorly so that in such cases a deflection in directions which do not extend orthogonally to the original propagation direction is advantageously accomplished by mirrors.

What is claimed is:

1. A diffraction-optical component for providing a radiation-diffracting grating structure, comprising:

a surface wave device including a substrate having a surface with an interaction region;

a surface wave source excitable with an adjustable frequency for producing surface waves on the surface of the substrate;

wherein the surface wave source has a directional characteristic and emits surface waves stronger in a preferred direction than in a direction opposite thereto, the surface waves emitted in the preferred direction forming a grating structure in the interaction region.

2. The diffraction-optical component according to claim 1, wherein the surface wave source comprises an electro-acoustic transducer which comprises an electrode structure with a plurality of sub-electrodes which are disposed spaced apart from adjacent sub-electrodes, a plurality of sections being provided wherein the sub-electrodes are periodically arranged in each section, the arrangement periods of different sections being different from one another.

3. The diffraction-optical component according to claim 1, wherein the surface wave source comprises an electro-acoustic transducer comprising two groups of finger electrodes, wherein the finger electrodes of each group are electro-conductively connected with one another and the finger electrodes of different groups are electrically insulated from one another, and wherein, between pairs of finger electrodes of different groups, there is arranged at least one intermediate electrode which is electrically insulated from the finger electrodes of each of the two groups.

4. The diffraction-optical component according to claim 3, wherein the finger electrodes of different groups extend at a distance from and in parallel to one another.

5. The diffraction optical component according to claim 3, wherein at least one branch electrode is disposed between each of plural pairs of adjacent finger electrodes of a first group of the two groups of finger electrodes, and wherein the branch electrodes are electro-conductively connected to the intermediate electrode.

6. The diffraction optical component according to claim 3, wherein at least one branch electrode is disposed between each of plural pairs of adjacent finger electrodes of a first group of the two groups of finger electrodes, wherein the branch electrodes are electro-conductively connected to the intermediate electrode, and wherein each of the branch electrodes and a respective finger electrode of a second group of the two groups of finger electrodes extend on a common straight line.

7. A diffraction-optical component for providing a radiation-diffracting grating structure, comprising:
 a surface wave device including a substrate having a surface with an interaction region;
 a surface wave source excitable with an adjustable frequency for producing surface waves to form a grating structure on the surface of the substrate;
 a surface wave receiver for receiving surface waves produced by the surface wave source and for delivering a measuring signal representing an amplitude of the surface waves at the location of the surface wave receiver; and
 a controller for adjusting the frequency for the excitation of the surface wave source in response to the measuring signal.

8. The diffraction-optical component according to claim 7, wherein the controller is configured to adjust the frequency such that the amplitude of the received surface waves is substantially maximal.

9. The diffraction-optical component according to claim 7,
 wherein an amplitude of the surface waves produced by the surface wave source has a first dependency upon the frequency for the excitation of the surface wave source;
 wherein a magnitude of the measuring signal has a second dependency upon a frequency of the received surface waves; and
 wherein said first dependency and said second dependency each have a characteristic having a maximum of a frequency width; and
 wherein the frequency width of the second dependency is greater than the frequency width of the first shape dependency.

10. The diffraction-optical component according to claim 9, wherein the controller is configured to control the frequency of the excitation of the surface wave source based on the second dependency.

11. A diffraction-optical component for providing a radiation-diffracting grating structure, comprising:
 a surface wave device including a substrate having a surface with an interaction region;
 a surface wave source for producing surface waves to form a grating structure on the surface of the substrate; and
 a surface wave damper provided outside of the interaction region,
 wherein the surface wave damper comprises an acousto-electric transducer for converting energy of the surface waves at the location of the acousto-electric transducer into electric energy.

12. The diffraction-optical component according to claim 11, wherein the acousto-electric transducer comprises at least two terminals for supplying the electric energy and a resistive circuit connected to the two terminals for dissipating the electric energy.

13. The diffraction-optical component according to claim 12, wherein the resistive circuit has an electric impedance which is adjusted to an impedance of the acousto-electric transducer between the two terminals such that the energy dissipated in the resistive circuit is maximal.

14. The diffraction-optical component according to claim 13, wherein the electric impedance of the resistive circuit and the electric impedance of the acousto-electric transducer have conjugated-complex impedance values.

15. The diffraction-optical component according to claim 11, wherein the acousto-electric transducer of the surface wave damper has a directional characteristic and is configured for damping surface waves which impinge on the surface wave damper from a preferred direction stronger than surface waves which impinge from a direction opposite thereto.

16. The diffraction-optical component according to claim 11, wherein the interaction region is disposed on a connecting line between the surface wave source and the surface wave damper.

17. The diffraction-optical component according to claim 11, wherein the surface wave source is disposed on a connecting line between the interaction region and the surface wave damper.

18. The diffraction optical component according to claim 11, wherein the surface wave source comprises an electro-acoustic transducer having a plurality of sub-electrodes which are spaced apart from each other with substantially a first pitch in a region of the electro-acoustic transducer, and
 wherein the acousto-electric transducer of the surface wave damper has a region in which a plurality of sub-electrodes are spaced apart from each other with substantially a second pitch which differs from the first pitch by 0.01% to 0.15%.

19. The diffraction optical component according to claim 11, wherein the surface wave source comprises an electro-acoustic transducer having a plurality of sub-electrodes which are spaced apart from each other with substantially a first pitch in a region of the electro-acoustic transducer, and
 wherein the acousto-electric transducer of the surface wave damper has a region in which a plurality of sub-electrodes are spaced apart from each other with substantially a second pitch which differs from the first pitch by 0.15% to 0.5%.

20. A diffraction-optical component for providing a radiation-diffracting grating structure, comprising:
 a surface wave device including a substrate having a surface with an interaction region;
 a surface wave source for producing surface waves to form a grating structure on the surface of the substrate; and
 a plurality of surface wave mirrors disposed on the substrate such that the plurality of surface wave mirrors provide a closed propagation path for the surface waves, the interaction region being disposed in the closed propagation path.

21. The diffraction-optical component according to claim 20, wherein the surface wave source has a directional characteristic and emits surface waves stronger in a preferred direction than in a direction opposite thereto, and wherein the surface wave source is disposed in the closed propagation path.

22. The diffraction-optical component according to claim 20, wherein the surface wave source is disposed outside of the closed propagation path and the surface waves emitted by the surface wave source are fed into the closed propagation path.

23. The diffraction-optical component according to claim 22, wherein a further surface wave mirror is provided for reflecting the surface waves emitted by the surface wave source into the closed propagation path.

24. The diffraction-optical component according to claim 20, wherein the plurality of surface wave mirrors is disposed such that the propagation path traverses the interaction region plural times from different directions.

25. A diffraction-optical component for providing a radiation-diffracting grating structure for light having a wavelength within a range from about 1 nm to about 100 nm, comprising:
a surface wave device including a substrate having a surface with an interaction region; and
at least one surface wave source for producing surface waves to form a surface grating structure on the surface within the interaction region of the substrate, wherein the surface wave source is disposed at a distance from the interaction region,
wherein the surface grating structure is formed by standing surface waves.

26. The diffraction-optical component according to claim 25, wherein the interaction region is disposed on a connecting line between the surface wave source and a surface wave mirror which reflects surface waves emitted by the surface wave source back to the interaction region.

27. The diffraction-optical component according to claim 25, wherein the interaction region is disposed within a surface wave resonator into which surface waves emitted by the surface wave source are fed-in.

28. The diffraction-optical component according to claim 27, wherein the surface wave resonator is formed by surface wave mirrors.

29. The diffraction-optical component according to claim 28, wherein a further surface wave mirror is provided for reflecting the surface waves emitted by the surface wave source into the surface wave resonator.

30. A diffraction-optical component for providing a radiation-diffracting grating structure, comprising:
a surface wave device including a substrate having a surface with an interaction region; and
at least one surface wave source for producing surface waves to form a grating structure on the surface of the substrate,
wherein the grating structure is formed by standing surface waves,
wherein the interaction region is disposed within a surface wave resonator into which surface waves emitted by the surface wave source are fed-in.

31. The diffraction-optical component according to claim 30, wherein the surface wave resonator is formed by surface wave mirrors.

32. The diffraction-optical component according to claim 30, wherein a further surface wave mirror is provided for reflecting the surface waves emitted by the surface wave source into the surface wave resonator.

33. An illumination system comprising:
a diffraction-optical component, the diffraction-optical component comprising:
a surface wave device including a substrate having a surface with an interaction region,
at least one surface wave source for producing surface waves to form a surface grating structure on the surface of the substrate,
wherein the surface grating structure is formed by standing surface waves; and
a radiation source, the radiation of which is directed to the interaction region of the surface wave device, wherein the radiation has a wavelength in a range of about 1 nm to about 100 nm.

34. The illumination system according to claim 33, wherein the radiation source is a pulsed radiation source, the radiation of which is directed to the interaction region of the surface wave device and the radiation pulses of which are synchronized with the surface wave device such that the pulses are incident on the interaction region during periods of time if amplitudes of the standing surface waves exceed a predetermined threshold value.

35. The illumination system according to claim 34, wherein the surface wave source comprises a driving means for adjusting a frequency and a phase position of the produced surface waves, and wherein the driving means adjusts the frequency and the phase position in response to a pulse sequence of the radiation source such that an intensity of radiation which is diffracted by the grating structure with a predetermined diffraction order has a predetermined value, in particular, substantially a maximum value.

36. The illumination system according to claim 34, wherein the radiation source is a synchrotron radiation source.

37. An illumination system comprising:
a diffraction-optical component, the diffraction-optical component comprising:
a surface wave device including a substrate having a surface with an interaction region,
at least one surface wave source for producing surface waves to form a grating structure on the surface of the substrate,
wherein the grating structure is formed by standing surface waves; and
a pulsed radiation source, the radiation of which is directed to the interaction region of the surface wave device and the radiation pulses of which are synchronized with the surface wave device such that the pulses are incident on the interaction region during periods of time if amplitudes of the standing surface waves exceed a predetermined threshold value.

38. The illumination system according to claim 37, wherein the surface wave source comprises a driving means for adjusting a frequency and a phase position of the produced surface waves, and wherein the driving means adjusts the frequency and the phase position in response to a pulse sequence of the radiation source such that an intensity of radiation which is diffracted by the grating structure with a predetermined diffraction order has a predetermined value, in particular, substantially a maximum value.

39. The illumination system according to claim 37, wherein the radiation source is a synchrotron radiation source.

40. A method for manufacturing a device, comprising at least one photolithographic step, wherein the photolithographic step comprises:
  providing an exposure system, the exposure system comprising:
    an illumination system, the illumination system comprising:
      a diffraction-optical component, the diffraction-optical component comprising:
        a surface wave device including a substrate having a surface with an interaction region,
        at least one surface wave source for producing surface waves to form a grating structure on the surface of the substrate,
        wherein the grating structure is formed by standing surface waves;
      and a radiation source, the radiation of which is directed to the interaction region of the surface wave device;
    the exposure system further comprising, at least one condenser system, a mask provided with a pattern to be imaged, an imaging system and a substrate support,
    wherein the condenser system and the mask are disposed such that radiation of the radiation source deflected in the interaction region in different spatial directions is directed to the mask, and
    wherein the imaging system and the substrate support are disposed such that radiation reflected by the mask is imaged onto a substrate mountable to the substrate support
  mounting a substrate provided with a radiation sensitive layer on the substrate support; and
  exposing the radiation sensitive substrate with radiation of the radiation source deflected into different spatial directions.

41. An exposure system comprising:
  an illumination system comprising:
    a diffraction-optical component, the diffraction-optical component comprising:
      a surface wave device including a substrate having a surface with an interaction region,
      at least one surface wave source for producing surface waves to form a grating structure on the surface of the substrate,
      wherein the grating structure is formed by standing surface waves; and
    a pulsed radiation source, the radiation of which is directed to the interaction region of the surface wave device and the radiation pulses of which are synchronized with the surface wave device such that the pulses are incident on the interaction region during periods of time if amplitudes of the standing surface waves exceed a predetermined threshold value;
  the exposure system further comprising, at least one condenser system, a mask provided with a pattern to be imaged, an imaging system and a substrate support,
    wherein the condenser system and the mask are disposed such that radiation of the radiation source deflected in the interaction region in different spatial directions is directed to the mask, and
    wherein the imaging system and the substrate support are disposed such that radiation reflected by the mask is imaged onto a substrate mountable to the substrate support.

42. A diffraction-optical component for providing a radiation-diffracting grating structure, comprising:
  a surface wave device including a substrate having a surface with an interaction region;
  a surface wave source excitable with an adjustable frequency for producing surface waves to form a grating structure on the surface of the substrate;
  wherein the surface wave source comprises an electro-acoustic transducer which comprises an electrode structure with a plurality of sub-electrodes which are disposed spaced apart from adjacent sub-electrodes, a plurality of sections being provided wherein the sub-electrodes are periodically arranged in each section, the arrangement periods of different sections being different from one another.

43. The diffraction-optical component according to claim 42, wherein the surface wave source comprises an electro-acoustic transducer comprising two groups of finger electrodes, wherein the finger electrodes of each group are electro-conductively connected with one another and the finger electrodes of different groups are electrically insulated from one another and wherein, between pairs of finger electrodes of different groups, there is arranged at least one intermediate electrode which is electrically insulated from the finger electrodes of each of the two groups.

44. The diffraction optical component according to claim 43, wherein at least one branch electrode is disposed between each of plural pairs of adjacent finger electrodes of a first group of the two groups of finger electrodes, and wherein the branch electrodes are electro-conductively connected to the intermediate electrode.

45. The diffraction-optical component according to claim 43, wherein the finger electrodes of different groups extend at a distance from and in parallel to one another.

46. The diffraction optical component according to claim 43, wherein at least one branch electrode is disposed between each of plural pairs of adjacent finger electrodes of a first group of the two groups of finger electrodes, wherein the branch electrodes are electro-conductively connected to the intermediate electrode, and wherein each of the branch electrodes and a respective finger electrode of a second group of the two groups of finger electrodes extend on a common straight line.

47. A diffraction-optical component for providing a radiation-diffracting grating structure, comprising:
  a surface wave device including a substrate having a surface with an interaction region;
  a surface wave source excitable with an adjustable frequency for producing surface waves to form a grating structure on the surface of the substrate;
  wherein the surface wave source comprises an electro-acoustic transducer comprising two groups of finger electrodes, wherein the finger electrodes of each group are electro-conductively connected with one another and the finger electrodes of different groups are electrically insulated from one another and, wherein between pairs of finger electrodes of different groups, there is arranged at least one intermediate electrode which is electrically insulated from the finger electrodes of each of the two groups.

48. The diffraction optical component according to claim 47, wherein at least one branch electrode is disposed between each of plural pairs of adjacent finger electrodes of a first group of the two groups of finger electrodes, and wherein the branch electrodes are electro-conductively connected to the intermediate electrode.

49. The diffraction-optical component according to claim 47, wherein the finger electrodes of different groups extend at a distance from and in parallel to one another.

50. The diffraction optical component according to claim 47, wherein at least one branch electrode is disposed between each of plural pairs of adjacent finger electrodes of a first group of the two groups of finger electrodes, wherein the branch electrodes are electro-conductively connected to the intermediate electrode, and wherein each of the branch electrodes and a respective finger electrode of a second group of the two groups of finger electrodes extend on a common straight line.

51. An illumination system comprising:
   a diffraction-optical component, the diffraction-optical component comprising:
      a surface wave device including a substrate having a surface with an interaction region;
      a surface wave source excitable with an adjustable frequency for producing surface waves on the surface of the substrate;
      wherein the surface wave source has a directional characteristic and emits surface waves stronger in a preferred direction than in a direction opposite thereto, the surface waves emitted in the preferred direction forming a grating structure in the interaction region; and
   a radiation source, the radiation of which is directed to the interaction region of the surface wave device.

52. An illumination system comprising:
   a diffraction-optical component, the diffraction-optical component comprising:
      a surface wave device including a substrate having a surface with an interaction region;
      a surface wave source excitable with an adjustable frequency for producing surface waves to form a grating structure on the surface of the substrate;
      a surface wave receiver for receiving surface waves produced by the surface wave source and for delivering a measuring signal representing an amplitude of the surface waves at the location of the surface wave receiver; and
      a controller for adjusting the frequency for the excitation of the surface wave source in response to the measuring signal; and
   a radiation source, the radiation of which is directed to the interaction region of the surface wave device.

53. An illumination system comprising:
   a diffraction-optical component, the diffraction-optical component comprising:
      a surface wave device including a substrate having a surface with an interaction region;
      a surface wave source for producing surface waves to form a grating structure on the surface of the substrate;
      a surface wave damper provided outside of the interaction region,
         wherein the surface wave damper comprises an acousto-electric transducer for converting energy of the surface waves at the location of the acousto-electric transducer into electric energy; and
   a radiation source, the radiation of which is directed to the interaction region of the surface wave device.

54. An illumination system comprising:
   a diffraction-optical component, the diffraction-optical component comprising:
      a surface wave device including a substrate having a surface with an interaction region;
      a surface wave source for producing surface waves to form a grating structure on the surface of the substrate; and
      a plurality of surface wave mirrors disposed on the substrate such that the plurality of surface wave mirrors provide a closed propagation path for the surface waves, the interaction region being disposed in the closed propagation path; and
   a radiation source, the radiation of which is directed to the interaction region of the surface wave device.

55. An illumination system comprising:
   a diffraction-optical component, the diffraction-optical component comprising:
      a surface wave device including a substrate having a surface with an interaction region;
      a surface wave source excitable with an adjustable frequency for producing surface waves to form a grating structure on the surface of the substrate;
      wherein the surface wave source comprises an electro-acoustic transducer which comprises an electrode structure with a plurality of sub-electrodes which are disposed spaced apart from adjacent sub-electrodes, a plurality of sections being provided wherein the sub-electrodes are periodically arranged in each section, the arrangement periods of different sections being different from one another; and
   a radiation source, the radiation of which is directed to the interaction region of the surface wave device.

56. An illumination system comprising:
   a diffraction-optical component, the diffraction-optical component comprising:
      a surface wave device including a substrate having a surface with an interaction region;
      a surface wave source excitable with an adjustable frequency for producing surface waves to form a grating structure on the surface of the substrate;
      wherein the surface wave source comprises an electro-acoustic transducer comprising two groups of finger electrodes, wherein the finger electrodes of each group are electro-conductively connected with one another and the finger electrodes of different groups are electrically insulated from one another and, wherein between pairs of finger electrodes of different groups, there is arranged at least one intermediate electrode which is electrically insulated from the finger electrodes of each of the two groups; and
   a radiation source, the radiation of which is directed to the interaction region of the surface wave device.

* * * * *